(12) United States Patent
Takenaka

(10) Patent No.: US 11,959,981 B2
(45) Date of Patent: Apr. 16, 2024

(54) MAGNETIC DETECTOR, TRANSMISSION LINE AND MAGNETIC DETECTION METHOD

(71) Applicant: YOKOGAWA ELECTRIC CORPORATION, Musashino (JP)

(72) Inventor: Kazuma Takenaka, Musashino (JP)

(73) Assignee: Yokogawa Electric Corporation, Musashino (JP)

( * ) Notice: Subject to any disclaimer, the term of this patent is extended or adjusted under 35 U.S.C. 154(b) by 395 days.

(21) Appl. No.: 17/282,591

(22) PCT Filed: Oct. 3, 2019

(86) PCT No.: PCT/JP2019/039204
§ 371 (c)(1),
(2) Date: Apr. 2, 2021

(87) PCT Pub. No.: WO2020/071511
PCT Pub. Date: Apr. 9, 2020

(65) Prior Publication Data
US 2021/0349162 A1 Nov. 11, 2021

(30) Foreign Application Priority Data
Oct. 5, 2018 (JP) .................. 2018-190387
Oct. 3, 2019 (JP) .................. 2019-182846

(51) Int. Cl.
*G01R 33/02* (2006.01)
*H01P 3/00* (2006.01)
(Continued)

(52) U.S. Cl.
CPC ............. *G01R 33/02* (2013.01); *H01P 3/003* (2013.01); *H01P 3/06* (2013.01); *H01P 3/08* (2013.01); *H01P 3/081* (2013.01)

(58) Field of Classification Search
None
See application file for complete search history.

(56) References Cited

U.S. PATENT DOCUMENTS

| 3,693,072 A | 9/1972 | Irons et al. | |
| 3,898,565 A * | 8/1975 | Takeuchi | ................. H04B 5/00 |
| | | | 343/788 |
| 2011/0089512 A1* | 4/2011 | Honkura | ................. G01R 33/18 |
| | | | 257/E29.323 |

FOREIGN PATENT DOCUMENTS

| EP | 2 698 612 B1 | 3/2018 |
| JP | 05-151535 A | 6/1993 |

(Continued)

OTHER PUBLICATIONS

Chinese Office Action issued Jan. 9, 2024 in Application No. 201980064858.5.

*Primary Examiner* — Jas A Sanghera
(74) *Attorney, Agent, or Firm* — Sughrue Mion, PLLC

(57) ABSTRACT

The magnetic detector 1 according to the present disclosure includes a transmission line 10 having a linear first conductor 11 including a magnetic material, a signal generator 30 configured to input a pulse as an incident wave to the transmission line 10, and a calculator 20 configured to detect a reflected wave caused by impedance mismatching at a magnetic field application position of the transmission line 10 and the incident wave. The calculator 20 calculates a position and a strength of the magnetic field applied to the transmission line 10 on the basis of the incident wave and the reflected wave.

14 Claims, 16 Drawing Sheets

(51) Int. Cl.
*H01P 3/06* (2006.01)
*H01P 3/08* (2006.01)

(56) References Cited

FOREIGN PATENT DOCUMENTS

| | | |
|---|---|---|
| JP | 2000-180520 A | 6/2000 |
| JP | 2001-289926 A | 10/2001 |
| JP | 2007-240289 A | 9/2007 |

* cited by examiner

MAGNETIC DETECTOR, TRANSMISSION LINE AND MAGNETIC DETECTION METHOD

CROSS-REFERENCE TO RELATED APPLICATION

This application is a National Stage of International Application No. PCT/JP2019/039204 filed Oct. 3, 2019, claiming priority based on Japanese Patent Application Nos. 2018-190387 filed on Oct. 5, 2018 and 2019-182846 filed on Oct. 3, 2019, the entire contents of each of which are herein incorporated by reference in their entireties.

TECHNICAL FIELD

The present disclosure relates to a magnetic detector, a transmission line and a magnetic detection method.

BACKGROUND

Magnetic detectors capable of detecting a magnetic field are known.

For example, Patent Literature 1 (PTL 1) discloses a magnetic field detector in which a magnetic body whose magnetic permeability changes with a magnetic field is disposed inside a distributed constant circuit. This magnetic field detector can detect a magnetic field at a predetermined position by detecting a change in electromagnetic field distribution in the distributed constant circuit caused by a change in magnetic permeability of the magnetic body due to the magnetic field.

CITATION LIST

Patent Literature

PTL 1: JPH05151535 (A)

SUMMARY

Technical Problem

The magnetic field detector disclosed in PTL 1 can detect a magnetic field at a predetermined position, but cannot detect a magnetic field at any position of a distributed constant circuit.

It is therefore an object of the present disclosure to provide a magnetic detector capable of detecting a magnetic field at any position of a distributed constant circuit, a transmission line and a magnetic detection method.

Solution to Problem

A magnetic detector according to some embodiments includes a transmission line having a linear first conductor including a magnetic material, a signal generator configured to input a pulse as an incident wave to the transmission line, and a calculator configured to detect a reflected wave caused by impedance mismatching at a magnetic field application position and the incident wave. The calculator calculates a position and a strength of the magnetic field applied to the transmission line on the basis of the incident wave and the reflected wave. According to the above described magnetic detector, a magnetic field can be detected at any position of a distributed constant circuit.

In a magnetic detector according to an embodiment, the calculator may calculate a position of the magnetic field applied to the transmission line on the basis of the difference between the time at which the incident wave is detected and the time at which the reflected wave is detected. In this manner, the calculator can accurately calculate the position of the magnetic field applied to the transmission line.

In the magnetic detector according to an embodiment, the calculator may calculate a strength of the magnetic field applied to the transmission line on the basis of an amplitude of the reflected wave. In this manner, the calculator can accurately calculate the strength of the magnetic field applied to the transmission line.

In the magnetic detector according to an embodiment, the calculator may detect data in a state where no magnetic field is applied to the transmission line as offset data, and use data of a difference obtained by subtracting the offset data from data of a reflected wave in a state where a magnetic field is applied to the transmission line as data of reflected wave for calculating the position and the strength of the magnetic field. In this manner, the calculator can reduce the influence of the reflected wave caused by the mechanical tolerance of components of the transmission line, etc.

In the magnetic detector according to an embodiment, the transmission line further includes a dielectric body and a second conductor, and may be any one of a coaxial cable, parallel two lines, a strip line, a microstrip line, a coplanar line and a waveguide. In this manner, by using a coaxial cable as the transmission line, the transmission line can be made flexible. Further, the transmission line can be made flexible by forming parallel two lines, a strip line, a microstrip line, a coplanar line, or a waveguide by a flexible substrate.

In the magnetic detector according to an embodiment, in the first conductor, magnetic a material may be distributed substantially uniformly, or a magnetic film containing a magnetic material may be formed on a surface of the conductor. In the first conductor, the magnetic film containing a magnetic material formed on the surface of the conductor may allow the hysteresis to be less likely to occur.

In the magnetic detector according to an embodiment, the transmission line may include a plurality of the first conductors. In this manner, when the transmission line includes a plurality of first conductors, the resistance loss of the transmission line can be reduced.

In the magnetic detector according to an embodiment, a coil that applies a bias magnetic field to the transmission line may be further provided. In this manner, when a coil for applying a bias magnetic field to the transmission line is provided, it is possible to determine whether a positive magnetic field is applied or a negative magnetic field is applied.

In the magnetic detector according to an embodiment, the pulse may have any shape of square wave, sine wave, triangular wave and saw-tooth wave. In this manner, a pulse generated by the signal generator can have various shapes.

In the magnetic detector according to an embodiment, the signal generator may sweep a sine wave pulse as the incident wave and input it to the transmission line, and the calculator may obtain an amplitude and a phase difference of the reflected wave to the incident wave for each frequency of the incident wave that is swept and input, generate frequency domain data of reflectance on the basis of the amplitude of the reflected wave to the incident wave, generate frequency domain data of phase difference on the basis of the phase difference of the reflected wave to the incident wave, and apply an inverse Fourier transform to the frequency domain data of reflectance and the frequency domain data of phase difference to generate time domain data of the reflected wave, to calculate a position and a strength of the magnetic field applied to the transmission line. In this manner, frequency domain data of reflectance and frequency domain data of phase difference are generated on the basis of the amplitude and the phase difference of the reflected wave to the incident wave, and as a result, even if there are fluctuations in the incident wave, the vector ratio of the reflected wave to the incident wave can be detected by canceling the fluctuations. Therefore, incident wave jitter can be removed, and synchronized measurements without temporal signal fluctuations can be made.

In the magnetic detector according to an embodiment, the signal generator sweeps the sine wave pulse and inputs it to the transmission line, and the calculator may apply an inverse Fourier transform to the frequency domain data of reflectance and the frequency domain data of phase difference to generate time domain data of the reflected wave as an impulse response or may integrate the frequency domain data of the reflectance and the frequency domain data of the phase difference to which an inverse Fourier transform is applied to generate time domain data of the reflected wave as a step response. In this manner, the time domain data of reflected wave is generated as an impulse response or a step response, and as a result a position and a strength of the magnetic field applied to the transmission line can be accurately calculated.

In the magnetic detector according to an embodiment, the signal generator may sweep the sine wave pulse and input it to the transmission line, and the calculator may perform convolution integral processing of the frequency domain data of reflectance and the frequency domain data of phase difference and then apply an inverse Fourier transform to generate time domain data of the reflected wave as a step response. In this manner, the convolution integral processing can reduce the time required for calculation compared to the case where the integral processing is performed after an inverse Fourier transform.

A transmission line according to some embodiments is a transmission line used for detecting a magnetic field. The transmission line includes a signal line in which a magnetic material is distributed substantially uniformly or a magnetic film containing a magnetic material is formed on a surface of a conductor. With such a transmission line, a magnetic field can be detected at any position of a distributed constant circuit.

A magnetic detection method according to some embodiments is a magnetic detection method for a magnetic detector including a transmission line having a linear first conductor including a magnetic material, a signal generator and a calculator. The method includes the steps of: inputting, by the signal generator, a pulse as an incident wave to the transmission line; detecting, by the calculator, a reflected wave caused by impedance mismatching at a magnetic field application position of the transmission line and the incident wave; and calculating, by the calculator, a position and a strength of the magnetic field applied to the transmission line on the basis of the incident wave and the reflected wave. According to the magnetic detection method described above, a magnetic field can be detected at any position of a distributed constant circuit.

BRIEF DESCRIPTION OF THE DRAWINGS

In the accompanying drawings:

FIG. 17 B is a diagram illustrating an example of a phase difference of the reflected wave to the incident wave in the magnetic detector in FIG. 13;

DETAILED DESCRIPTION

An embodiment of the present invention will be described below with reference to the drawings.

In the description of the present specification, the terms related to the magnetic field have the following meanings.

Magnetic field: A general term that includes a magnetic field to be measured (external magnetic field), an environmental magnetic field, a bias magnetic field and the like.

Magnetic field at a predetermined (any) position: A magnetic field that includes an external magnetic field and an environmental magnetic field.

External magnetic field (magnetic field applied to a transmission line): A magnetic field not present in the initial state and is applied from outside to a transmission line, and is generated by a magnet and the like.

Environmental magnetic field: A magnetic field applied to a transmission line from an initial state, and is generated from a geomagnetic field or other electronic devices. In other words, a magnetic field that causes a noise when an external magnetic field is measured.

Bias magnetic field: A magnetic field that is applied to a sensor in advance using a coil or the like to add a polarity to a sensor output or improve linearity.

Figure 1:
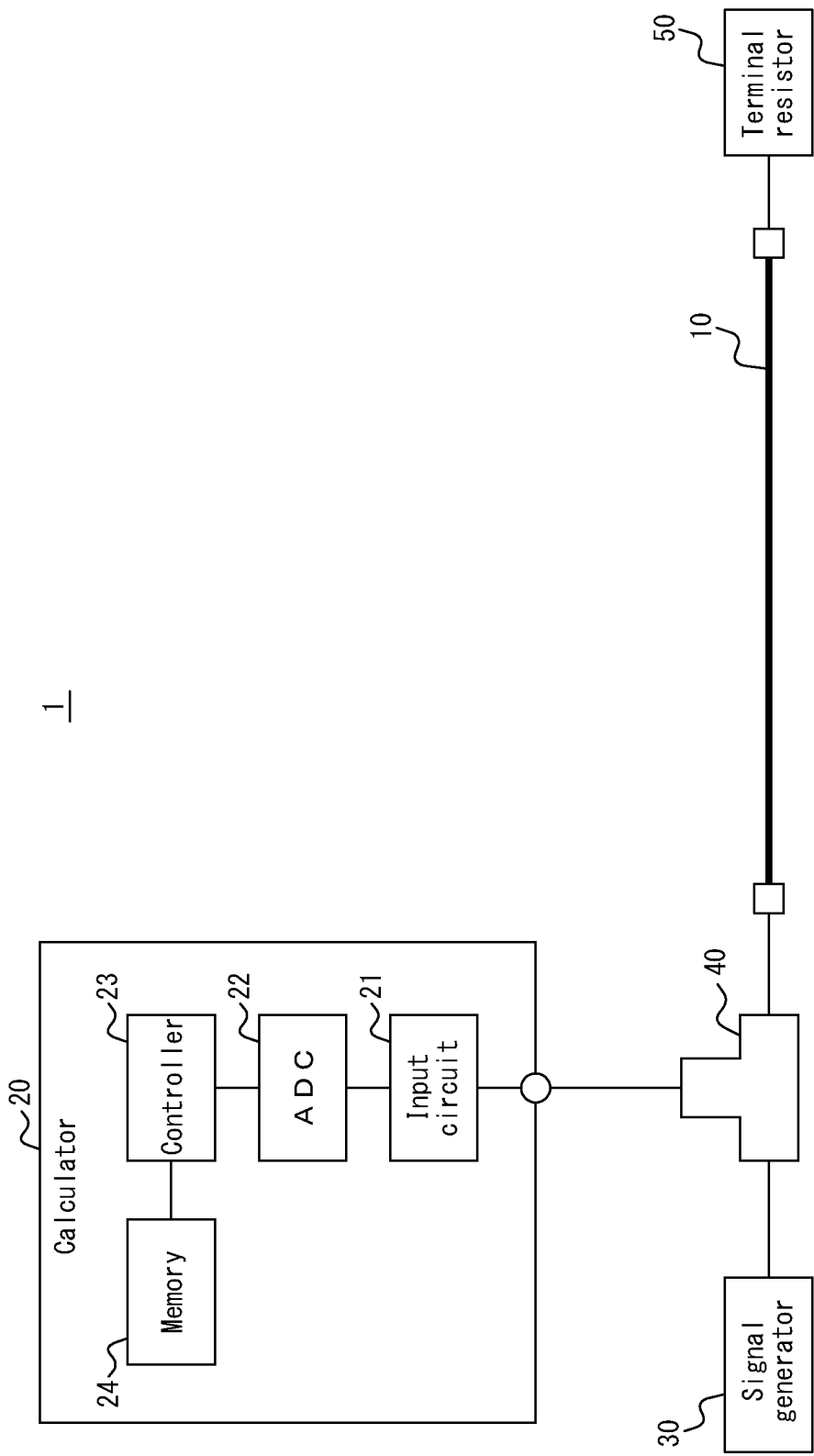
FIG. 1 is a diagram illustrating a schematic configuration of a magnetic detector according to an embodiment.

FIG. 1 is a diagram illustrating a schematic configuration of a magnetic detector 1 according to an embodiment. The magnetic detector 1 includes a transmission line 10, a calculator 20, a signal generator 30, a connector 40 and a terminal resistor 50.

The transmission line 10 is a linear transmission line. The transmission line 10 has a predetermined characteristic impedance. The transmission line 10 may be configured as a coaxial cable or a Flexible Printed Circuits (FPC), for example. When the transmission line 10 is configured as a coaxial cable or an FPC, the transmission line 10 can be flexible and can be bent easily. Since the transmission line 10 has flexibility, it can be freely installed according to the shape of a measurement object.

One end of the transmission line 10 is connected to the connector 40, and the other end thereof is connected to the terminal resistor 50. Since the other end of the transmission line 10 is connected to the terminal resistor 50, almost no reflected wave is generated to the incident wave input from the signal generator 30 via the connector 40. The other end of the transmission line 10 may be connected to an attenuator instead of the terminal resistor 50.

Figure 2:
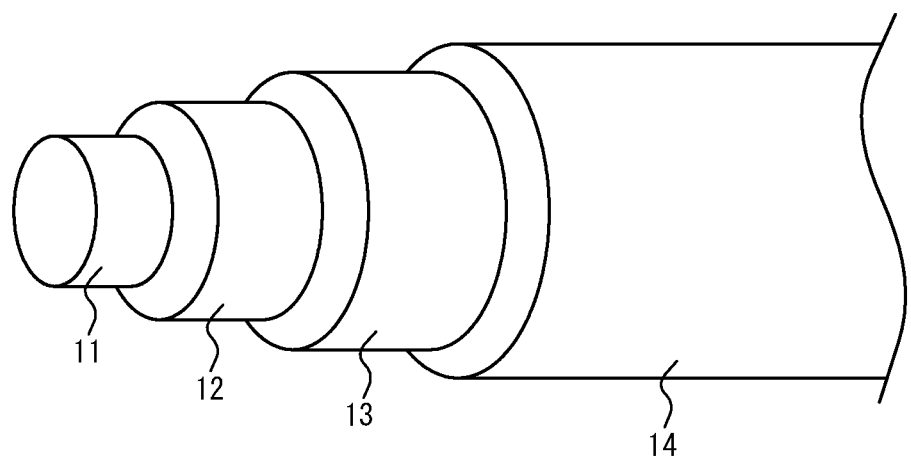
FIG. 2 is a diagram illustrating a schematic configuration of a transmission line according to an embodiment.

An example of the case where the transmission line 10 is configured as a coaxial cable will be described with reference to FIG. 2. As illustrated in FIG. 2, the transmission line 10 includes a first conductor (signal line) 11, a dielectric body 12, a second conductor (shield line) 13 and a coating 14.

The first conductor 11 is a linear conductor containing a magnetic material. Although the first conductor 11 may contain a magnetic material at least on the surface thereof, in the example illustrated in FIG. 2, the first conductor 11 contains a magnetic material that is substantially uniformly distributed.

The first conductor 11 may contain a soft magnetic material with low holding force and high magnetic permeability. The first conductor 11 may contain, for example, amorphous alloy or permalloy.

The amorphous alloy and the permalloy contain a magnetic material with high magnetic permeability. Thus, the transmission line 10 that includes the first conductor 11 has high circumferential magnetic permeability and axial magnetic permeability. Since the circumferential magnetic permeability and the axial magnetic permeability are high, in the transmission line 10, when an external magnetic field is applied, impedance changes due to either one of or both of the magnetic impedance effect on the surface of the first conductor 11 and the magnetization (magnetic wall movement) inside the first conductor 11.

For example, an amorphous alloy with an irregular arrangement of atoms may be a Fe-based amorphous alloy, such as an Fe—Co—Si—B alloy (Fe-rich), an Fe—Si—B—C alloy, an Fe—Si—B alloy, an Fe—Si—B—Nb—Cu alloy or an Fe—P—B alloy. Further, an amorphous alloy may be a Co-based amorphous alloy, such as an Fe—Co—Si—B alloy (Co-rich), a Co—Fe—Cr—Si—B alloy, or a Co—Fe—Mn—Cr—Si—B alloy. An amorphous alloy may also be a Ni-based amorphous alloy.

For example, permalloy, which is an alloy with Fe and Ni as its main components, may be 78-Permalloy (JIS standard: Permalloy A) with a Ni content of 78.5%, 45-Permalloy (JIS standard: Permalloy B) with a Ni content of 45% (40-50%), or permalloy obtained by adding Mo, Cu or Cr to 78-Permalloy (JIS standard: Permalloy C) and the like.

The volume resistivity of permalloy is about 68 μΩcm. This is more than 40 times the volume resistivity of copper, which is 1.68 μΩcm.

The first conductor 11 may contain, as other soft magnetic materials other than amorphous alloy and permalloy, an Fe—Si—Al alloy (e.g. sendust), an Fe—Co alloy (e.g. permendur), a Mn—Zn or a Ni—Zn alloy (e.g. soft ferrite), or an Fe—Si alloy (e.g. silicon steel or electromagnetic steel).

When the magnetic field applied to the transmission line 10 is a relatively large magnetic field of about 10 [Oe (Oersted)], the first conductor 11 may contain a single metal such as Fe, Ni or Co as a magnetic material.

The first conductor 11 may contain a nanocrystal soft magnetic material in which nanocrystal grains are dispersed in an amorphous phase.

The dielectric body 12 has a cylindrical shape and covers the first conductor 11. The dielectric body 12 may be an insulator, such as polytetrafluoroethylene (PTFE) or polyethylene.

The second conductor 13 has a cylindrical shape and covers the dielectric body 12. The second conductor 13 may be, for example, a braided wire composed of copper wires.

The coating 14 has a cylindrical shape and covers the second conductor 13. The coating 14 protects the first conductor 11, the dielectric body 12 and the second conductor 13 contained inside.

The first conductor 11, the dielectric body 12, the second conductor 13 and the coating 14 may be made of flexible materials. This allows the transmission line 10 to be flexible.

The calculator 20 detects, as an incident wave, a voltage pulse (hereinafter simply referred to also as a "pulse") input from the signal generator 30 via the connector 40. The calculator 20 detects, as a reflected wave, a pulse input from the transmission line 10 via the connector 40. The details of the reflected wave generated in the transmission line 10 will be described later.

As illustrated in FIG. 1, the calculator 20 includes an input circuit 21, an AD converter (ADC) 22, a controller 23 and a memory 24.

The input circuit 21 detects an incident wave input from the signal generator 30 via the connector 40. The input circuit 21 detects a reflected wave input from the transmission line 10 via the connector 40. The input circuit 21 includes an attenuation circuit, a preamplifier circuit, and the like. The input circuit 21 adjusts the amplitude of the incident wave and the reflected wave input as an analog signal to be within an appropriate range for the input specification of the AD converter 22, and outputs an analog signal with an adjusted amplitude to the AD converter 22.

The AD converter 22 converts the analog signal received from the input circuit 21 into digital data, and outputs it to the controller 23.

The controller 23 controls each component of the calculator 20. The controller 23 may be configured as a processor, such as a Central Processing Unit (CPU), etc. Details of the functions of the controller 23 will be described later.

The memory 24 is connected to the controller 23. The memory 24 has any storage device such as a Hard Disk Drive (HDD), a Solid State Drive (SSD), an Electrically Erasable Programmable Read-Only Memory (EEPROM), a Read-Only Memory (ROM) and a Random Access Memory (RAM). The memory 24 may function as, for example, a main storage, an auxiliary storage, or a cache memory. The memory 24 is not limited to the one built in the calculator 20, and may be an external storage device connected by a digital input/output port such as a Universal Serial Bus (USB) or the like.

The signal generator 30 generates a voltage pulse. The signal generator 30 is connected to the connector 40. The pulse generated by the signal generator 30 is input, as an incident wave, to the transmission line 10 via the connector 40. Further, the pulse generated by the signal generator 30 is branched at the connector 40 and is input to the calculator 20.

The signal generator 30 may generate, as a pulse, a short pulse or a pulse having a fast rise time. With such a pulse, when the calculator 20 detects a plurality of reflected waves, the reflected waves can be separated easily. Further, with such a pulse, the power consumption of the signal generator 30 can be reduced.

The pulse generated by the signal generator 30 is not particularly limited, but may have, for example, a rise time of 200 [ps], a pulse width of 500 [ps], a pulse height of 1 [V], or the like.

The pulse generated by the signal generator 30 may have any shape. The pulse generated by the signal generator 30 may have the shape of a square wave, a sine wave, a triangle wave, or a saw tooth wave, for example.

The connector 40 interconnects the transmission line 10, the calculator 20 and the signal generator 30. The connector 40 may be, for example, a T-type connector.

A state where the magnetic detector 1 detects the magnetic field application position on the transmission line 10 when a magnetic field is applied to transmission line 10 will be described with reference to FIG. 3. In an example illustrated in FIG. 3, a magnet 60 is disposed in the vicinity of the transmission line 10, and the external magnetic field with the magnetic field strength $H_{ex}$ generated by the magnet 60 is applied to the transmission line 10.

For the transmission line 10, when the external magnetic field with the magnetic field strength $H_{ex}$ is applied, an impedance changes due to the magnetic impedance effect at the magnetic field application position where the magnetic field is applied. The magnetic impedance effect will be described below.

Figure 4:
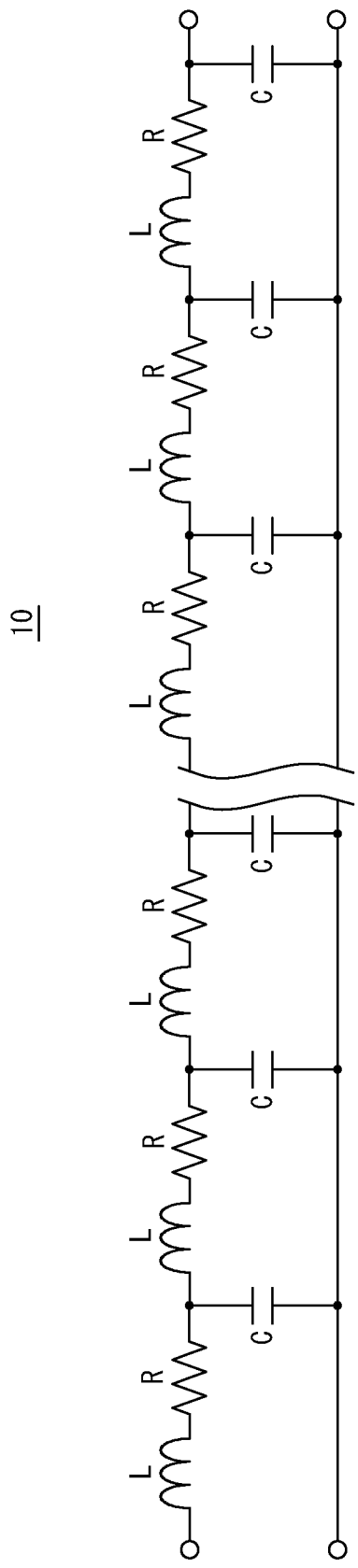
FIG. 4 is a diagram in which the transmission line is illustrated as a distributed constant circuit.

As illustrated in FIG. 4, the transmission line 10 can be represented as equivalent distributed constant circuits. In FIG. 4, L is an inductance component of the first conductor 11 per unit length, R is a resistance component of the first conductor 11 per unit length and C is a capacitance component between the first conductor 11 and the second conductor 13 per unit length.

In the transmission line 10, when an external magnetic field with the magnetic field strength $H_{ex}$ is applied, the resistance component R and the inductance component L of the first conductor 11 change at the magnetic field application position where a magnetic field is applied.

The first conductor 11 of the transmission line 10 is magnetized in one direction in a circumferential direction when a pulse is input from the signal generator 30. In this case, assuming that the direction in which the transmission line 10 extends is an axial direction, the circumferential direction is a direction of rotation about the axial direction. In this state, as illustrated in FIG. 3, when an external magnetic field with the magnetic field strength $H_{ex}$ is applied to the axial direction of the transmission line 10, the magnetic moment induced in the circumferential direction rotates along the direction in which the external magnetic field with the magnetic field strength $H_{ex}$ is applied.

The magnetic permeability of the first conductor 11 in the circumferential direction is changed by the rotation of the magnetic moment. Since the impedance of the transmission line 10 depends on the magnetic permeability of the first conductor 11 in the circumferential direction, when the magnetic permeability of the first conductor 11 in the circumferential direction at the magnetic field application position changes, the impedance of the transmission line 10 at the magnetic field application position changes.

The magnetic impedance effect is expressed by the following equation (1) when the skin effect is remarkable (skin depth δ<<radius a of the first conductor 11).

[Equation 1]

$$Z = R + j\omega L \cong \frac{a}{2\sqrt{2\rho}} R_{DC}(1+j)\sqrt{\omega\mu(H_{ex})} \quad (1)$$

where Z is the impedance of the transmission line 10, ω is the angular frequency when the pulse is approximated as a sine wave, a is the radius of the first conductor 11, ρ is the electrical resistivity of the first conductor 11, $R_{DC}$ is the DC resistance, μ is the magnetic permeability of the first conductor 11 in the circumferential direction, and $H_{ex}$ is the magnetic field strength of the external magnetic field applied to the transmission line 10. To describe ω in more detail, the pulse waveform can be approximated by a waveform with a time width of −T/2 to T/2 of a sine wave (T is the period of the sine wave). In this case, a pulse with a peak voltage height of V is a waveform in which a V/2 offset is added to a sine wave with an amplitude of V/2. Thus the pulse rising time, $t_r \approx T/2 = 1/(2f)$, and the angular frequency $\omega = 2\pi f$. It is to be noted that a pulse is approximated as a sine wave is an example, and may be approximated as the other waveforms.

Referring to the equation (1), it can be seen that, when the magnetic permeability μ of the first conductor 11 in the circumferential direction changes, not only the inductance component L but also the resistance component R changes.

Figure 3:
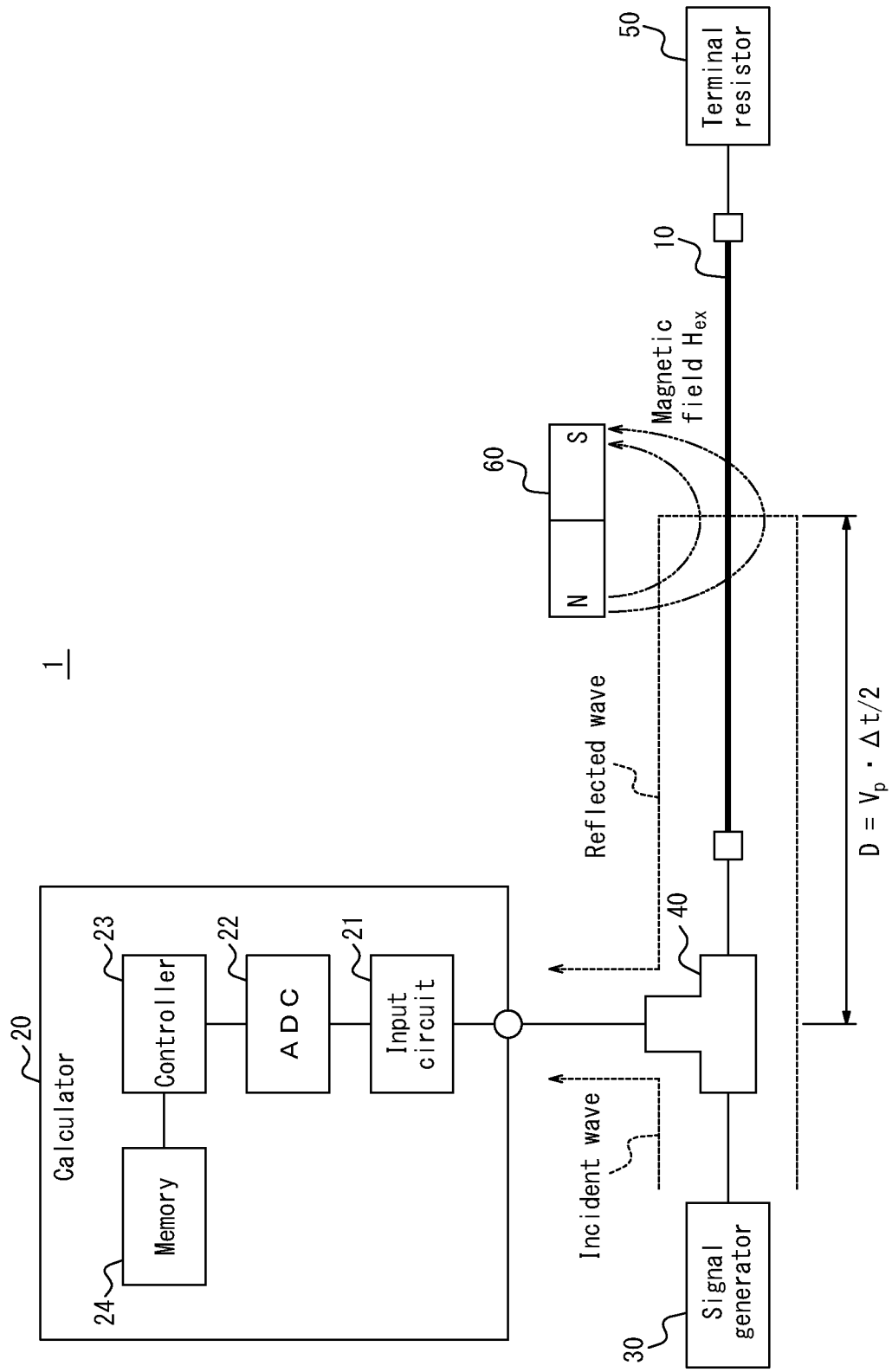
FIG. 3 is a diagram illustrating a state where the magnetic detector in FIG. 1 detects a magnetic field.

As illustrated in FIG. 3, when the external magnetic field with the magnetic field strength $H_{ex}$ is applied to the transmission line 10 by the magnet 60, the impedance of the transmission line 10 changes at the magnetic field application position. Thus, in this state, when a pulse is input as an incident wave from the signal generator 30 to the transmission line 10, a reflected wave is generated at the magnetic field application position due to the impedance mismatching at the magnetic field application position.

The reflected wave generated at the magnetic field application position travels in the transmission line 10 in the opposite direction to the incident wave and is input to the calculator 20 via the connector 40.

Therefore, the time difference Δt between the time at which the calculator 20 detects the incident wave and the time at which the calculator 20 detects the reflected wave is the time during which the reflected wave reciprocates between the connector 40 and the magnetic field application position. Thus, the distance D from the connector 40 to the magnetic field application position is expressed by the equation (2).

[Equation 2]

$$D = \frac{\Delta t}{2} V_p = \frac{\Delta t}{2} \alpha c \quad (2)$$

where $V_p$ is the propagation velocity of the electromagnetic wave in the transmission line 10, α is the wavelength shortening rate in the transmission line 10, and c is the propagation velocity of the electromagnetic wave in vacuum.

Figure 5:
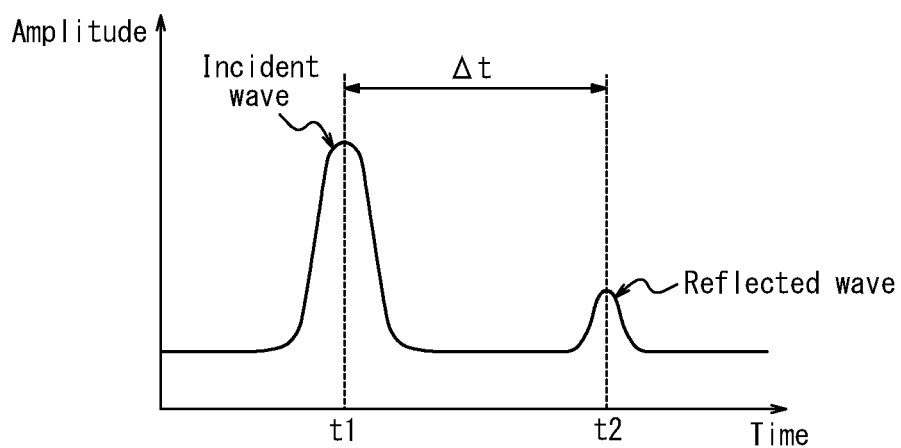
FIG. 5 is a diagram illustrating an example of an incident wave and a reflected wave detected by a calculator.

FIG. 5 illustrates an example where the calculator 20 detects the incident wave and the reflected wave with the time difference Δt.

In the equation (2), the propagation velocity c of the electromagnetic wave in vacuum is the speed of light in vacuum, $3.0 \times 10^8$ [m/s], and is known. Further, the wavelength shortening ratio α in the transmission line 10 is a value that depends on the components of the transmission line 10, such as the dielectric body 12, and is known. Therefore, the controller 23 of the calculator 20 can calculate the distance D from the connector 40 to the magnetic field application position on the basis of the time difference Δt between the time at which the incident wave is detected and the time at which the reflected wave is detected. That is, the controller 23 of the calculator 20 can calculate the position of the magnetic field applied to the transmission line 10.

Subsequently, calculation of the strength of the magnetic field applied to the transmission line 10 by the magnetic detector 1 will be described.

As described above, when the external magnetic field with the magnetic field strength $H_{ex}$ is applied to the transmission line 10, the impedance changes at the magnetic field application position due to the magnetic impedance effect. In the transmission line 10, a reflected wave is generated when an incident wave travels from the position where the impedance matches to the magnetic field application position where the impedance is unmatched. In this case, the reflectance r of the reflected wave to the incident wave is expressed by the following equation (3).

[Equation 3]

$$r = \frac{Z_m - Z_0}{Z_m + Z_0} = \frac{(Z_0 + \Delta Z) - Z_0}{(Z_0 + \Delta Z) + Z_0} = \frac{\Delta Z}{2Z_0 + \Delta Z} \quad (3)$$

where $Z_m$ is the impedance at the magnetic field application position of the transmission line 10, $Z_o$ is the characteristic impedance at the position of the transmission line 10 where the impedance is matched, and ΔZ is the amount of change in the impedance at the magnetic field application position of the transmission line 10.

Further, in the transmission line 10, the voltage of the reflected wave $V_R$ generated when the incident wave travels from the position where the impedance is matched to the magnetic field application position where the impedance is unmatched is expressed by the following equation (4).

[Equation 4]

$$V_R = rV_i = \frac{\Delta Z}{2Z_0 + \Delta Z} V_i \quad (4)$$

where $V_i$ is a voltage of the incident wave.

In the equation (4), the characteristic impedance $Z_o$ at the position where the impedance of the transmission line 10 is matched is known. Further, the voltage of the incident wave $V_1$ is the amplitude of the pulse generated by the signal generator 30 and is known. Therefore, the controller 23 of the calculator 20 can calculate the amount of change in the impedance ΔZ at the magnetic field application position of the transmission line 10 on the basis of the voltage of the reflected wave $V_R$.

Figure 6:
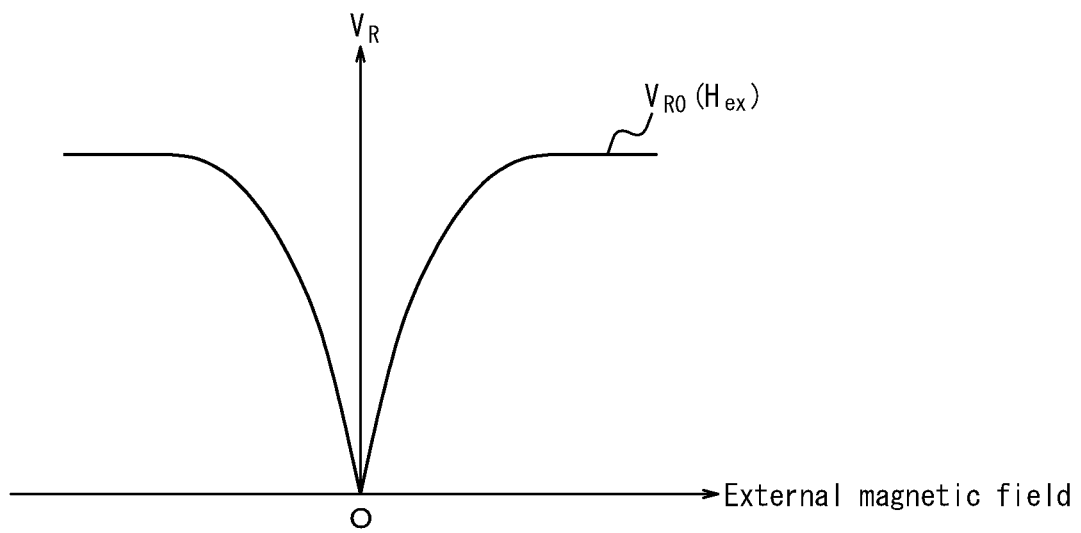
FIG. 6 is a diagram illustrating a relationship between a magnetic field applied to the transmission line and an amplitude of the reflected wave.

FIG. 6 illustrates a relationship between the magnetic field applied to the transmission line 10 and the voltage of the reflected wave $V_R$. As illustrated in FIG. 6, when the magnetic field applied to the transmission line 10 is zero, the voltage of the reflected wave $V_R$ is zero. The voltage of the reflected wave $V_R$ increases as the strength of the magnetic field applied to the transmission line 10 increases.

Since the amount of change ΔZ in the impedance depends on the magnetic field strength $H_{ex}$ of the external magnetic field applied to the transmission line 10, the controller 23 of the calculator 20 can calculate the strength of the magnetic field applied to the transmission line 10 on the basis of the amount of change ΔZ in the impedance. More specifically, the magnetic detector 1 can calculate the amount of change ΔZ in the impedance by substituting the voltage of the detected reflected wave $V_R$ into the equation (4). The magnetic detector 1 can calculate the strength of the magnetic field $H_{ex}$ applied to the transmission line 10 by substituting $Z_o + \Delta Z$ into Z in the equation (1). It is to be noted that the magnetic detector 1 may calculate the magnetic field strength $H_{ex}$ by using an equation that approximates the equation (1) (e. g., a linear approximation equation), not by using the equation (1).

In this manner, the magnetic detector 1 can calculate the distance D from the connector 40 to the magnetic field application position by measuring the time difference Δt between the time at which the incident wave is detected and the time at which the reflected wave is detected. Further, the magnetic detector 1 can calculate the strength of the magnetic field applied to the transmission line 10 by measuring the amplitude of the voltage of the reflected wave $V_R$. Therefore, the magnetic detector 1 can calculate the magnetic field application position of the transmission line 10 and the strength of the magnetic field applied to the transmission line 10 simultaneously.

When calculating the magnetic field application position of the transmission line 10 and the strength of the magnetic field applied to the transmission line 10, the calculator 20 may use the data of the difference obtained by subtracting the offset data from the voltage of the reflected wave V R as the data of the reflected wave used for calculating the magnetic field application position and the strength of the magnetic field. The calculator 20 may store, as the offset data, the data detected in a state where the magnetic field is not applied to the transmission line 10 in the memory 24. In this manner, the calculator 20 uses the data of the difference obtained by subtracting the offset data from the voltage of the reflected wave $V_R$, and thus can reduce the influence of the reflected wave caused by the mechanical tolerance of the components of the transmission line 10, distortion caused by bending and the like of the transmission line 10, the environmental magnetic field applied from the initial state (e. g., the magnetic field generated by geomagnetism or electronic devices, etc.), and the like.

In FIG. 3, the case where the magnet 60 applies an external magnetic field to the transmission line 10 is illustrated, but the magnet 60 is not only one that applies an external magnetic field to the transmission line 10. The magnetic detector 1 can calculate simultaneously the magnetic field application position of the transmission line 10 and the strength of the magnetic field applied to the transmission line 10 even if an external magnetic field due to a Helmholtz coil, an external magnetic field due to leakage from the magnetic material, or an external magnetic field generated by an eddy current is applied to the transmission line 10. Further, the magnetic detector 1 can measure not only the external magnetic field applied by the magnet 60 or the like but also the environmental magnetic field due to the geomagnetism or the like.

Subsequently, the reflected wave generated at the magnetic field application position of the transmission line 10 will be described in detail with reference to FIGS. 7A-7C.

Figure 7A:
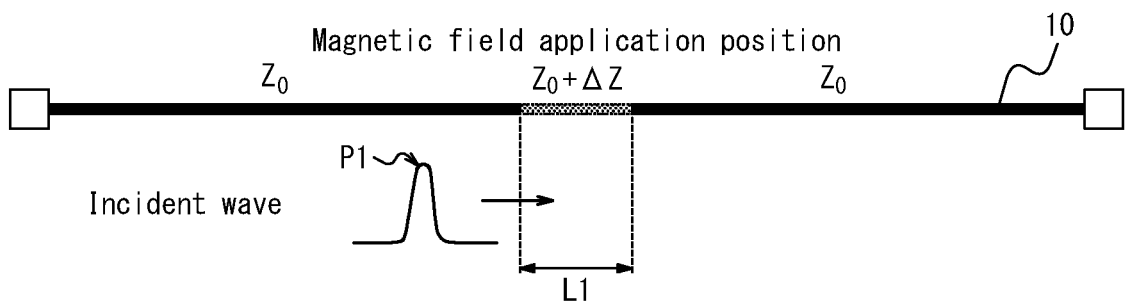
FIG. 7A is a diagram illustrating an example of the incident wave in the transmission line.

FIG. 7A illustrates the state before the incident wave P1 reaches the magnetic field application position of the transmission line 10. FIG. 7B illustrates the state where the incident wave P1 enters the magnetic field application position of the transmission line 10. FIG. 7C illustrates the state after the incident wave P1 passes the magnetic field application position of the transmission line 10.

As illustrated in FIG. 4, the transmission line 10 can be represented as equivalent distributed constant circuits. When a pulse passes through the magnetic field application position of the transmission line 10, the resistance component R and the inductance component L of the first conductor 11 at the magnetic field application position change due to the magnetic impedance effect. Thus, the impedance of the transmission line 10 changes at the magnetic field application position. In general, the impedance Z of the distributed constant circuit is expressed by the equation (5) below.

[Equation 5]

$$Z = \sqrt{\frac{R+j\omega L}{G+j\omega C}} \cong \sqrt{\frac{R+j\omega L}{j\omega C}} \quad (5)$$

where, although G is a conductance component corresponding to the leakage resistance per unit length between the first conductor 11 and the second conductor 13, the conductance component G is omitted because it is very small.

When the skin effect is remarkable (skin depth δ<<radius a of the first conductor 11), in consideration of the magnetic impedance effect, the impedance Z of the transmission line 10 is expressed by the following equation (6).

[Equation 6]

$$Z = \sqrt{\frac{\frac{a}{2\sqrt{2\rho}}R_{DC}(1+j)\sqrt{\omega\mu(H_{ex})}}{j\omega C}} \quad (6)$$

In FIG. 7A, since the incident wave P1 has not reached the magnetic field application position of the transmission line 10, the incident wave P1 is traveling where the impedance of the transmission line 10 is constant. Thus no reflected wave is generated.

Figure 7B:
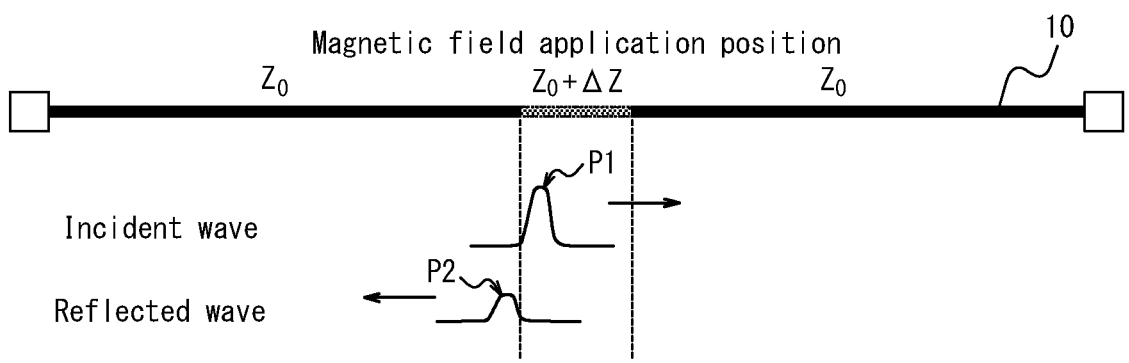
FIG. 7B is a diagram illustrating an example of the incident wave and the reflected wave in the transmission line.

FIG. 7B illustrates the state where the incident wave P1 enters the magnetic field application position of the transmission line 10. As illustrated in FIG. 7B, at the magnetic field application position of the transmission line 10, the impedance of the transmission line 10 is increased by ΔZ due to the magnetic impedance effect, and is $Z_o+\Delta Z$. In this case, in the transmission line 10, the incident wave P1 is incident on the line with an impedance $Z_o+\Delta Z$ from the line with a characteristic impedance $Z_o$, thus a positive reflected wave P2 is generated.

Figure 7C:
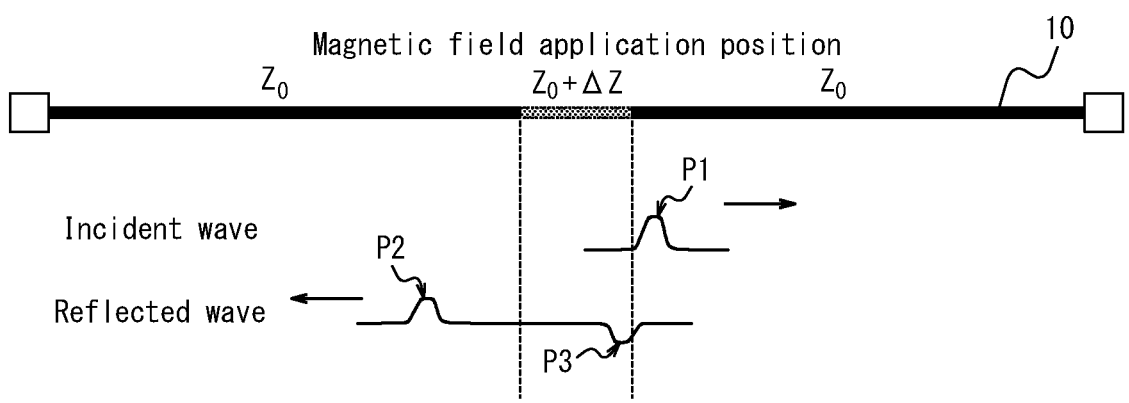
FIG. 7C is a diagram illustrating an example of the incident wave and the reflected wave in the transmission line.

FIG. 7C illustrates the state after the incident wave P1 passes the magnetic field application position of the transmission line 10. In FIG. 7C, contrary to the state illustrated in FIG. 7B, the incident wave P1 is incident from the line with an impedance $Z_o+\Delta Z$ to the line with a characteristic impedance $Z_o$, thus a negative reflected wave P3 is generated.

In this manner, when the magnetic field is applied to the transmission line 10, a negative reflected wave is generated at the magnetic field application position. In examples illustrated in FIGS. 7A-7C, since the length L1 of the magnetic field application position illustrated in FIG. 7A is longer than the pulse width of the incident wave P1, the positive and negative reflected waves exist apart from each other.

The calculator 20 may use the peak time of the positive reflected wave P2 when calculating the time difference Δt, but is not limited to this. The calculator 20 may use the rise or fall time of the positive reflected wave P2. Further, the calculator 20 may use the peak, rise or fall time of a negative reflected wave P3. In addition, the calculator 20 may calculate the length L1 of the magnetic field application position using the time difference calculated using the positive reflected wave P2 and the time difference calculated using the negative reflected wave P3.

Depending on the relationship between the pulse width of the incident wave and the length of the magnetic field application position, there may be a partial overlap of positive and negative reflected waves. Such state is illustrated in FIGS. 8A-8C.

Figure 8A:
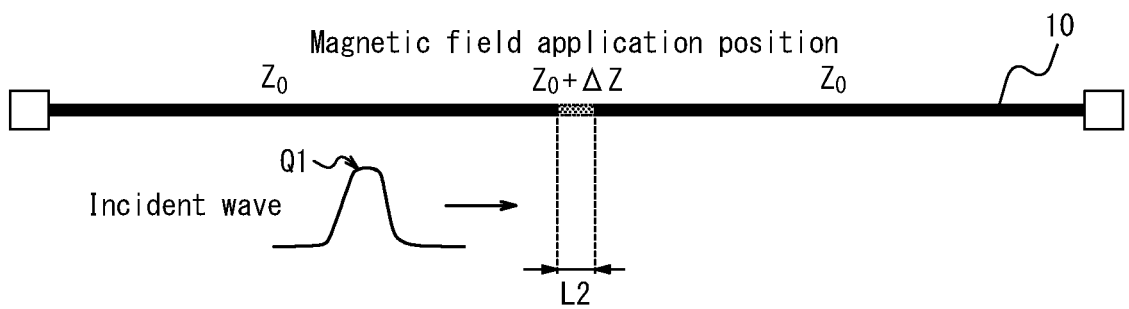
FIG. 8A is a diagram illustrating another example of the incident wave in the transmission line.

FIG. 8A illustrates the state before the incident wave Q1 reaches the magnetic field application position of the transmission line 10. FIG. 8B illustrates the state where the incident wave Q1 enters the magnetic field application position of the transmission line 10. FIG. 8C illustrates the state after the incident wave Q1 passes the magnetic field application position of the transmission line 10.

Figure 8B:
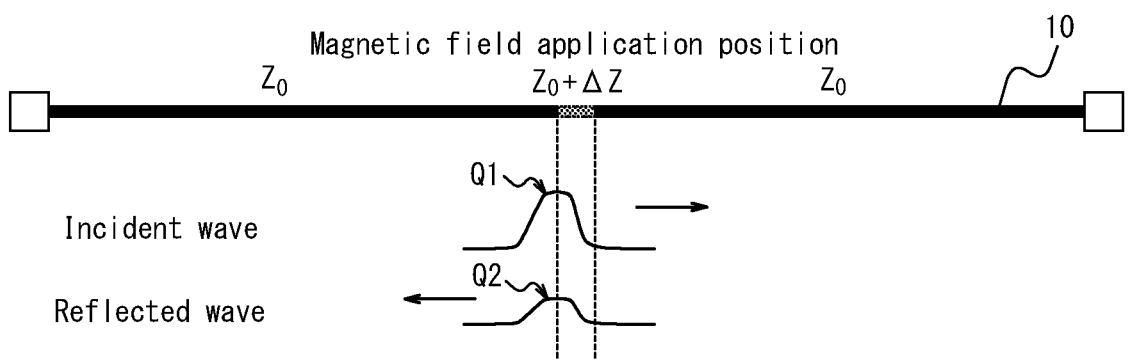
FIG. 8B is a diagram illustrating another example of the incident wave and the reflected wave in the transmission line.
Figure 8C:
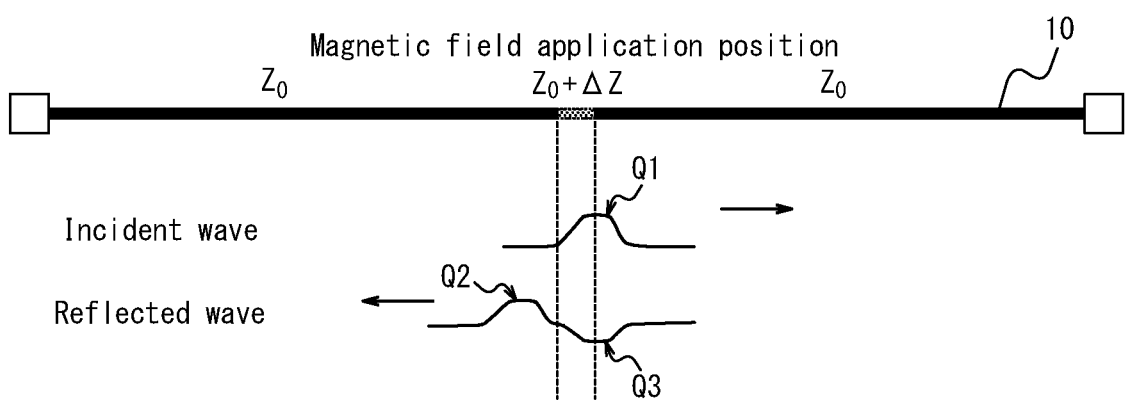
FIG. 8C is a diagram illustrating still another example of the incident wave and the reflected wave in the transmission line.

In the examples illustrated in FIGS. 8A-8C, the pulse width of the incident wave Q1 and the length L2 of the magnetic field application position illustrated in FIG. 8A are about the same. Thus, as illustrated in FIG. 8C, the positive reflected wave Q2 and the negative reflected wave Q3 are partially overlapped.

Although the signal generator 30 may generate a pulse in any shape, if the rise time is shortened, the position resolution when the calculator 20 detects the magnetic field application position can be increased. Therefore, when there are multiple magnetic field application positions described later, the calculator 20 can clearly separate the magnetic field application positions. On the other hand, if the rise time of the pulse is increased, the attenuation of the incident wave and the reflected wave is reduced even if the transmission distance of the pulse becomes longer, which allows the calculator 20 to measure a long distance.

(When there are a Plurality of Magnetic Field Application Positions)

When the magnetic field is applied at multiple positions in the transmission line 10, the calculator 20 detects the time difference Δt and the voltage of the reflected wave $V_R$ with respect to the reflected wave generated at each of the multiple magnetic field application positions. In this manner, the magnetic detector 1 can simultaneously calculate the magnetic field application position and the magnetic field strength for each of the multiple magnetic field application positions of the transmission line 10.

Another Example of Coaxial Cable

Figure 9A:
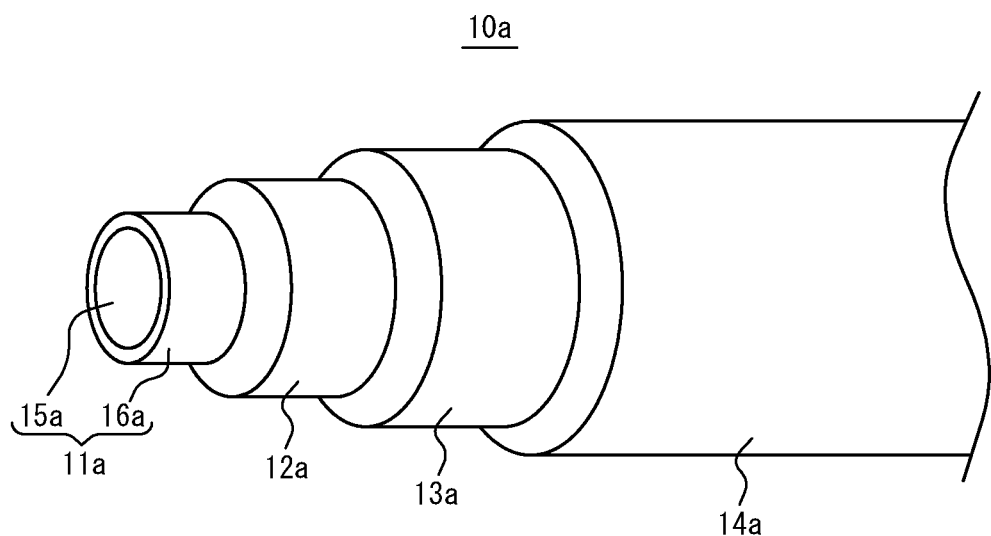
FIG. 9A is a diagram illustrating another example of a schematic configuration of a transmission line configured as a coaxial cable.
Figure 9B:
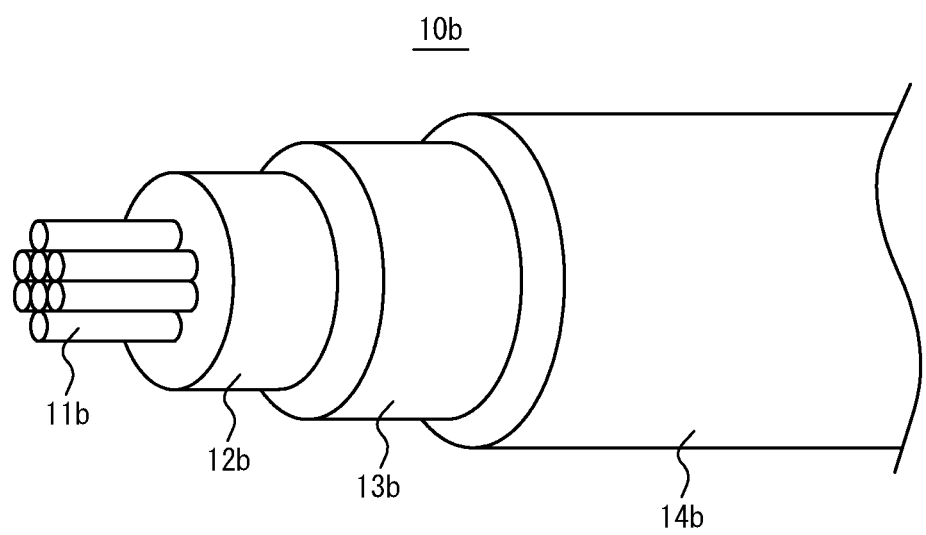
FIG. 9B is a diagram illustrating still another example of the schematic configuration of the transmission line configured as a coaxial cable.

FIGS. 9A and 9B illustrate another example where the transmission line 10 is configured as a coaxial cable. The transmission line 10a illustrated in FIG. 9A includes a first conductor (signal line) 11a, a dielectric body 12a, a second conductor (shield line) 13a and a coating 14a. The dielectric body 12a, the second conductor 13a and the coating 14a respectively have the same configuration of the dielectric body 12, the second conductor 13 and the coating 14 illustrated in FIG. 2.

The first conductor 11a includes the conductor 15a and the magnetic film 16a. The conductor 15a is a non-magnetic conductor. The magnetic film 16a is a film containing a magnetic material and is formed on the surface of the conductor 15a. The magnetic material contained in the magnetic film 16a may be the magnetic material similar to those contained in the first conductor 11 illustrated in FIG. 2.

The magnetic film 16a can be formed on the surface of the conductor 15a by, for example, plating, vapor deposition, sputtering, or Chemical Vapor Deposition (CVD).

In the first conductor 11a, since the conductor 15a is a non-magnetic conductor, the impedance change does not occur inside the first conductor 11a due to magnetization (domain wall movement). Therefore, in the first conductor 11a, hysteresis is unlikely to occur, and the magnetic field can be detected with high sensitivity.

The transmission line 10b illustrated in FIG. 9B includes a plurality of first conductors (signal lines) 11b, a dielectric body 12b, a second conductor (shield line) 13b and a coating 14b. The dielectric body 12b, the second conductor 13b and the coating 14b respectively have the configuration similar to that of the dielectric body 12, the second conductor 13 and the coating 14b illustrated in FIG. 2.

Each of the first conductors 11b may have the same configuration as that of the first conductor 11 illustrated in FIG. 1.

In this manner, since a plurality of first conductors 11b are bundled together, the resistance loss of the first conductors 11 as a whole can be reduced. Thus, even if the transmission line 10b is long, the attenuation of the incident wave and the reflected wave can be reduced. This allows the magnetic detector 1 to have a long transmission line 10b and measure the position and the strength of the magnetic field applied.

Another Example of Transmission Line

The transmission line 10 does not have to be configured as a coaxial cable as long as it is a line having a characteristic impedance. For example, the transmission line 10 may be configured as parallel two lines, a strip line, a microstrip line, a coplanar line or a waveguide. FIGS. 10A-10D illustrate an example in which the transmission line 10 is not configured as a coaxial cable.

Figure 10A:
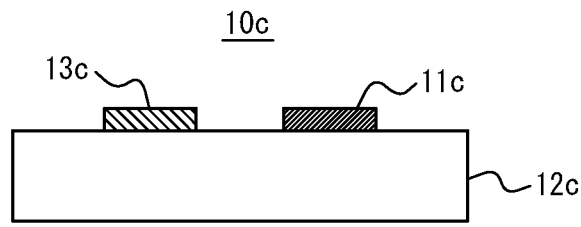
FIG. 10A is a diagram illustrating an example of a transmission line not configured as a coaxial cable.

FIG. 10A is a diagram illustrating a cross section when the transmission line 10c is configured as parallel two lines. The transmission line 10c includes a first conductor (signal line) 11c, a dielectric body 12c and a second conductor (shield line) 13c. As with the first conductor 11 illustrated in FIG. 2, the first conductor 11c contains a magnetic material. The first conductor 11c is formed as a thin film on the dielectric body 12c.

Figure 10B:
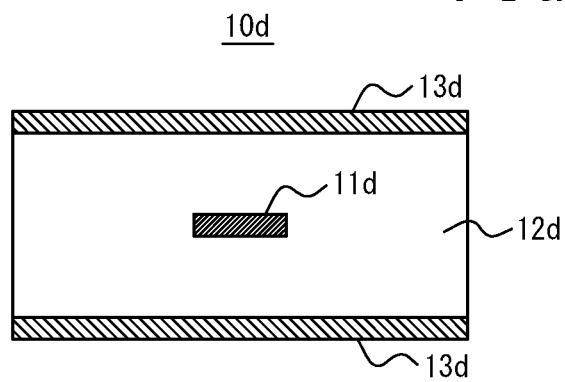
FIG. 10B is a diagram illustrating another example of the transmission line not configured as a coaxial cable.

FIG. 10B is a diagram illustrating a cross section when the transmission line 10d is configured as a strip line. The transmission line 10d includes a first conductor (signal line) 11d, a dielectric body 12d and a second conductor (shield line) 13d. As with the first conductor 11 illustrated in FIG. 2, the first conductor 11d contains a magnetic material. The first conductor 11d is formed as a thin film inside the dielectric body 12d.

Figure 10C:
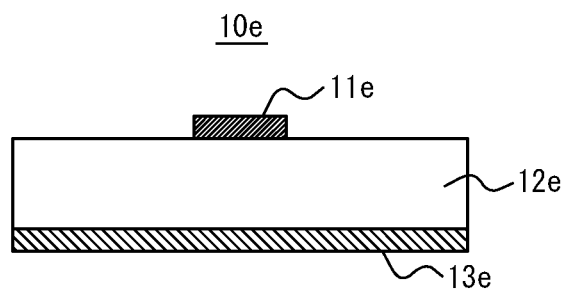
FIG. 10C is a diagram illustrating still another example of the transmission line not configured as a coaxial cable.

FIG. 10C is a diagram illustrating a cross section when the transmission line 10e is configured as a strip line. The transmission line 10e includes a first conductor (signal line) 11e, a dielectric body 12e and a second conductor (shield line) 13e. As with the first conductor 11 illustrated in FIG. 2, the first conductor 11e contains a magnetic material. The first conductor 11e is formed as a thin film on the dielectric body 12e.

Figure 10D:
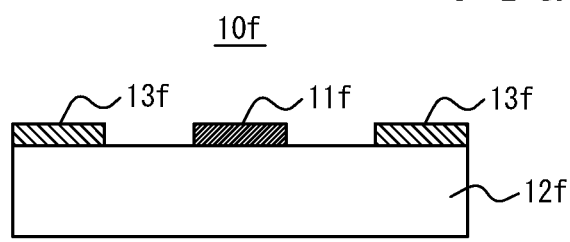
FIG. 10D is a diagram illustrating yet still another example of the transmission line not configured as a coaxial cable.

FIG. 10D is a diagram illustrating a cross section when the transmission line 10f is configured as a coplanar line. The transmission line 10f includes a first conductor (signal line) 11f, a dielectric body 12f and a second conductor (shield line) 13f. As with the first conductor 11 illustrated in FIG. 2, the first conductor 11f contains a magnetic material. The first conductor 11f is formed as a thin film on the dielectric body 12f.

As with the dielectric body 12 illustrated in FIG. 2, the dielectric bodies 12c-12f illustrated in FIGS. 10A-10D may be, for example, an insulator such as polytetrafluoroethylene (PTFE) or polyethylene.

As with the second conductor 13 illustrated in FIG. 2, the second conductors 13c-13f illustrated in FIGS. 10A-10D may be made of copper, for example.

The magnetic impedance effect in the transmission lines 10c-10f including thin-film first conductors 11c-11f as illustrated in FIGS. 10A-10D will be described below. Assuming that each thickness of the first conductors 11c-11f is d, when the skin effect is remarkable (skin depth δ<<d/2), the magnetic impedance effect is expressed by the following equations (7) and (8).

[Equation 7]

$$Z = R + j\omega L \cong \frac{\omega \mu \delta l}{4w}(1-j) = \frac{1}{4w}(1-j)\sqrt{2\rho\omega\mu(H_{ex})} \quad (7)$$

[Equation 8]

$$\delta = \sqrt{\frac{2\rho}{\omega\mu}} \quad (8)$$

where w is the width of the first conductors 11c-11f and 1 is the length of the first conductors 11c-11f.

As with the transmission line 10 configured as a coaxial cable illustrated in FIG. 2, the magnetic permeability of the first conductor 11c-11f in the circumferential direction changes due to rotation of the magnetic moment, also in the transmission lines 10c-10f illustrated in FIGS. 10A-10D. The impedance of the transmission lines 10c-10f depends on the magnetic permeability of the first conductors 11c-11f in the circumferential direction. Thus, when the magnetic permeability of the first conductors 11c-11f in the circumferential direction at the magnetic field application position changes, the impedance of the transmission lines 10c-10f at the magnetic field application position changes.

The transmission lines 10c-10f illustrated in FIGS. 10A-10D can be made flexible as in the case of being configured by a coaxial cable, for example, by configuring with a flexible substrate.

The first conductors 11c-11f illustrated in FIGS. 10A-10D may have a configuration in which a magnetic film is formed on the surface of a non-magnetic conductor, as with the first conductor 11a illustrated in FIG. 9A.

The transmission lines 10c-10f illustrated in FIGS. 10A-10D may each include a plurality of first conductors 11c-11f, as with the transmission line 10b illustrated in FIG. 9B.

(Application of Bias Magnetic Field)

Figure 11:
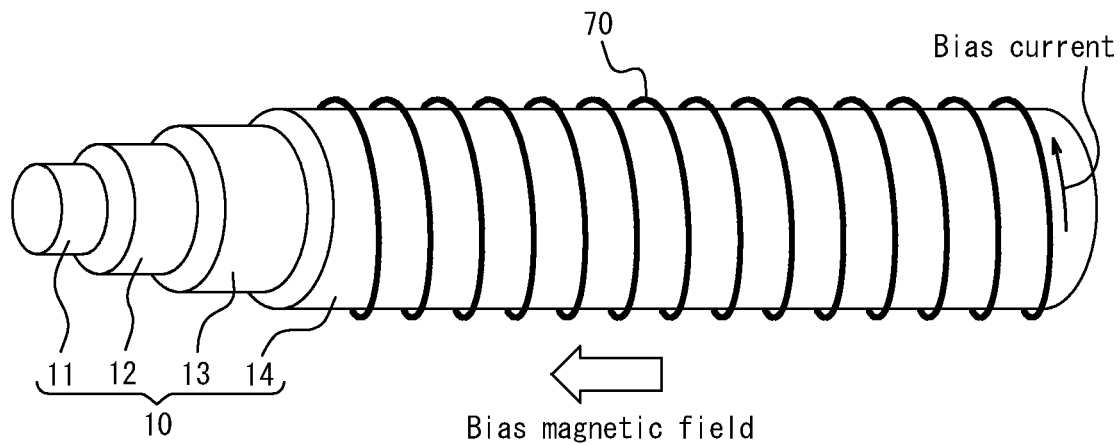
FIG. 11 is a diagram illustrating a state where a bias magnetic field is applied by a coil arranged around the transmission line.

In the magnetic detector 1, as illustrated in FIG. 11, a coil 70 may be provided around the transmission line 10. As illustrated in FIG. 11, the coil 70 applies a bias magnetic field to the transmission line 10 in the axial direction (longitudinal direction) by applying a bias current.

Figure 12:
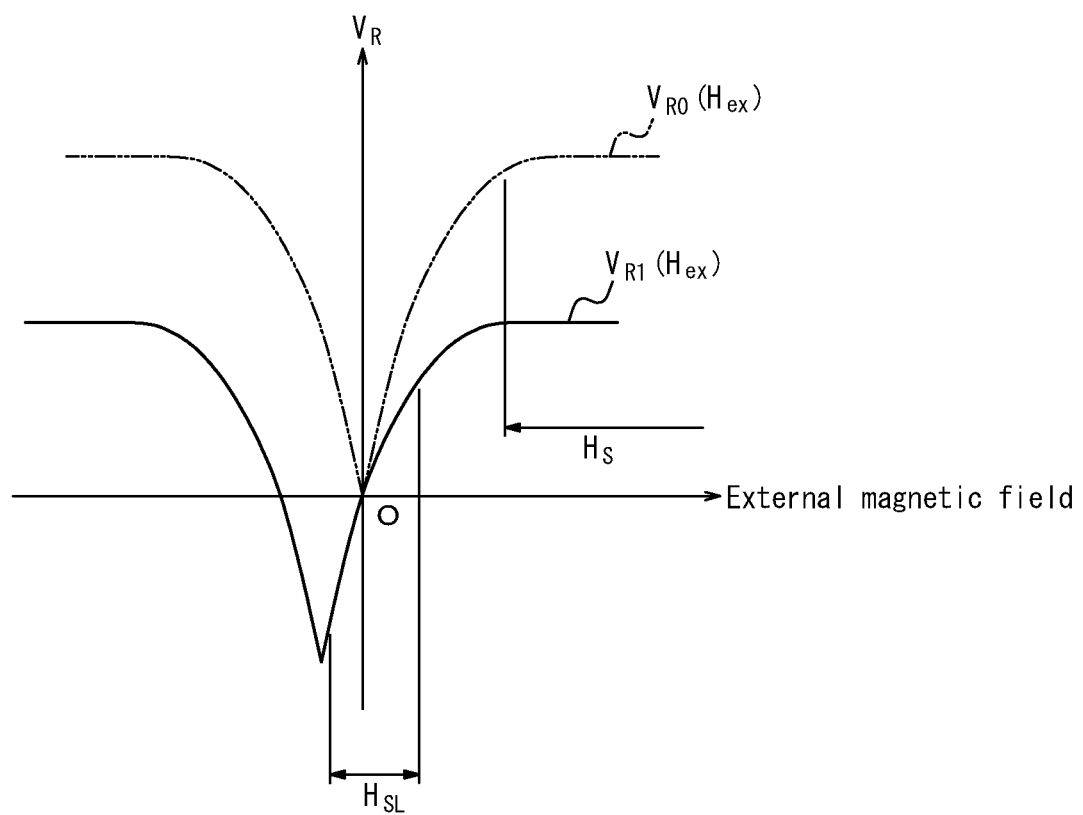
FIG. 12 is a diagram illustrating a relationship between the magnetic field and the amplitude of the reflected wave in a state where a bias magnetic field is applied.

In this manner, when a bias magnetic field is uniformly applied to the transmission line 10 in the positive direction by the coil 70, the characteristic impedance of the transmission line 10 increases from $Z_0$ to $Z_1$ ($Z_0 < Z_1$), and the relationship between the magnetic field applied to the transmission line 10 and the voltage of the reflected wave $V_R$ will be offset from the graph $V_{R0}(H_{ex})$ illustrated in FIG. 6 to the graph $V_{R1}(H_{ex})$ illustrated in FIG. 12. When no external magnetic field is applied to the transmission line 10, the characteristic impedance is uniform at $Z_1$, thus no reflected wave is generated. When a positive magnetic field is applied as an external magnetic field, an external magnetic field is applied in addition to the bias magnetic field, thus the characteristic impedance of the magnetic field application portion is $Z_1+\Delta Z$, and reflected waves as illustrated in FIGS. 7B and 7C are generated. When a negative magnetic field is applied as an external magnetic field, the external magnetic field is applied in the opposite direction to the bias magnetic field, thus the characteristic impedance of the magnetic field application portion is $Z_1-\Delta Z$, and the reflected wave in the opposite phase of FIGS. 7B and 7C is generated. This allows the magnetic detector 1 to determine not only the strength of the magnetic field applied to the transmission line 10, but also if a positive magnetic field has been applied or a negative magnetic field has been applied. Further, although any strength of bias magnetic field may be applied, it should be smaller than the saturation magnetic field (the magnetic field in a range shown by Hs in FIG. 12) and should be the strength that improves sensor linearity (the strength that allows the range shown by $H_{sL}$ in FIG. 12 to be substantially linear).

In the magnetic detector 1 according to an embodiment described above, a magnetic field can be detected at any position of a distributed constant circuit. More specifically, in the magnetic detector 1, the signal generator 30 inputs a pulse as an incident wave to the transmission line 10, and the calculator 20 detects a reflected wave caused by the impedance mismatching at the magnetic field application position of the transmission line 10 and an incident wave. Then, the calculator 20 calculates the position and the strength of the magnetic field applied to the transmission line 10 on the basis of the incident wave and the reflected wave. Therefore, the magnetic detector 1 according to an embodiment can detect a magnetic field at any position of the transmission line 10 that can be represented as a distributed constant circuit.

Further, in the magnetic detector 1 according to an embodiment, the magnetic field application position of the transmission line 10 and the strength of the magnetic field applied to the transmission line 10 can be simultaneously detected, thus a non-uniform external magnet field generated from an object to be measured in the transmission line 10 can be detected. Therefore, this allows the magnetic detector 1 to measure the external magnetic field generated by the magnetization distribution of the magnetic material to be measured, and the external magnetic field generated by the magnetic field distribution due to defects on the metal surface to be measured. Further, the magnetic detector 1 can be applied to a wide variety of measuring instruments such as a geomagnetic detector, an eddy current flaw detector, a magnetic microscope, a current sensor and a magneto encephalography device.

Further, in the magnetic detector 1 according to an embodiment, a plurality of magnetic field application positions of the transmission line 10 can be detected. For example, a conventional magnetic sensor such as a hall element, a Magneto-Resistance (MR) sensor, a Magneto-Impedance (MI) sensor, a fluxgate, a pickup coil, a Superconducting QUantum Interference Device (SQUID) and Optically-Pumped Atomic Magnetometer (OPAM) are point measuring devices or small area surface measuring devices. Thus, in order to measure the distribution of magnetic field, it was necessary to install a plurality of magnetic sensors. However, the scalability was low as it was necessary to provide a separate switching circuit to combine the signal processing circuits. On the other hand, since the magnetic detector 1 according to an embodiment can detect a plurality of magnetic field application positions, it is possible to measure the distribution of the magnetic field with one device.

Further, in the magnetic detector 1 according to an embodiment, since the first conductor 11 in the transmission line 10 contains a magnetic material having high magnetic permeability such as an amorphous alloy or a permalloy, a minute magnetic field of about 10 m [Oe] can be detected.

(Frequency Sweep)

Figure 13:
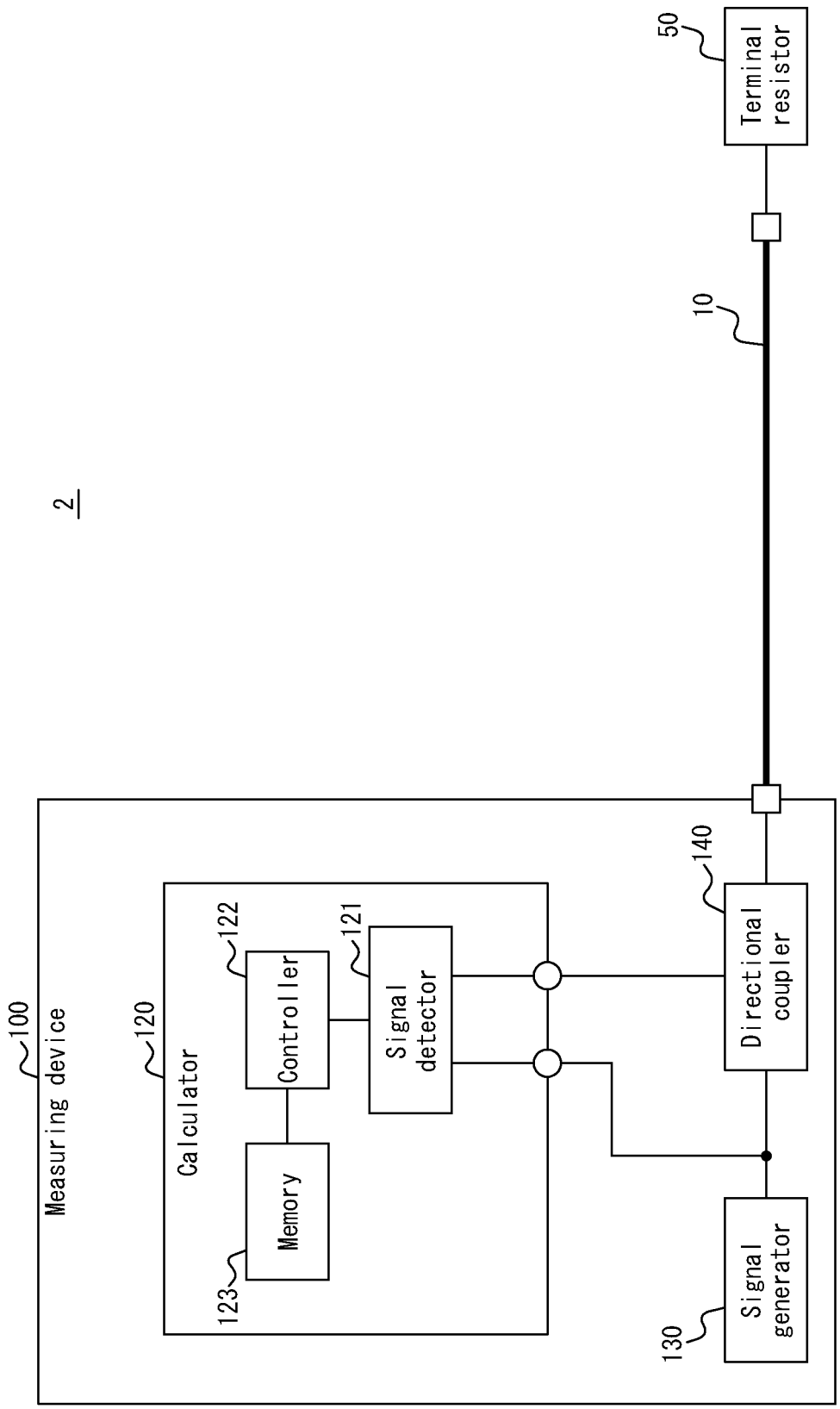
FIG. 13 is a diagram illustrating a schematic configuration of a magnetic detector according to another embodiment.

FIG. 13 is a diagram illustrating a schematic configuration of a magnetic detector 2 according to another embodiment. For the magnetic detector 2 according to another embodiment, the difference from the magnetic detector 1 illustrated in FIG. 1 will be mainly described, and the same contents as the magnetic detector 1 illustrated in FIG. 1 will be omitted as appropriate.

The magnetic detector 2 differs from the magnetic detector 1 illustrated in FIG. 1 in that it processes the data based on the incident wave and the reflected wave as the frequency domain data first, and then converts the frequency domain data into the time domain data for processing. The processing by the magnetic detector 2 after converting the frequency domain data into the time domain data for the incident wave and the reflected wave is the same as the processing by the magnetic detector 1 illustrated in FIG. 1.

The magnetic detector 2 includes the measuring device 100, the transmission line 10 and the terminal resistor 50. The transmission line 10 and the terminal resistor 50 may have the same configuration as the transmission line 10 and the terminal resistor 50 illustrated in FIG. 1.

Figure 14:
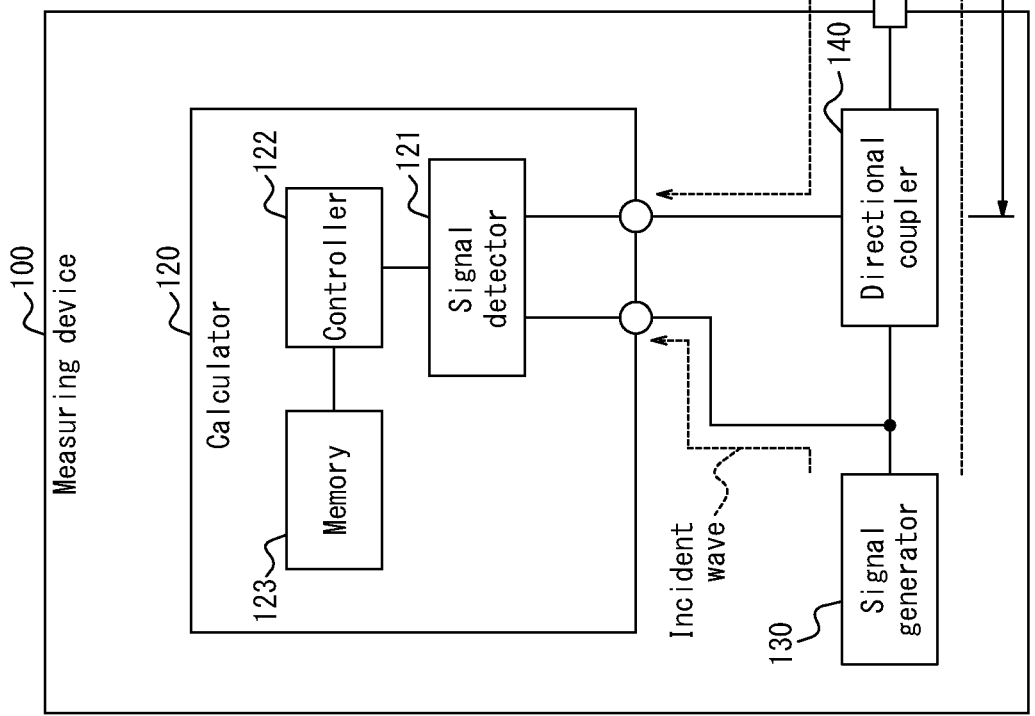
FIG. 14 is a diagram illustrating a state where a magnetic field is detected in the magnetic detector in FIG. 13.

FIG. 14 is a diagram illustrating a state where the magnetic detector 2 detects the magnetic field application position on the transmission line 10 when the magnetic field is applied to the transmission line 10. As with the case illustrated in FIG. 3, when the magnet 60 is disposed in the vicinity of the transmission line 10, the external magnetic field with the magnetic field strength $H_{ex}$ generated by the magnet 60 is applied to the transmission line 10. When the external magnetic field with the magnetic field strength $H_{ex}$ is applied, the impedance changes at the magnetic field application position of the transmission line 10 due to the magnetic impedance effect. In this state, when an incident wave is input from the signal generator 130 to the transmission line 10, a reflected wave is generated at the magnetic field application position due to the impedance mismatching at the magnetic field application position.

Referring back to FIG. 13, description of the magnetic detector 2 will be continued.

The measuring device 100 includes a calculator 120, a signal generator 130 and a directional coupler 140. The measuring device 100 may be, for example, a measuring device that functions as a vector network analyzer.

The calculator 120 detects a sine wave pulse input from the signal generator 130 as an incident wave. The incident wave may be input directly from the signal generator 130 to the calculator 120 or input via the directional coupler 140.

Figure 15:
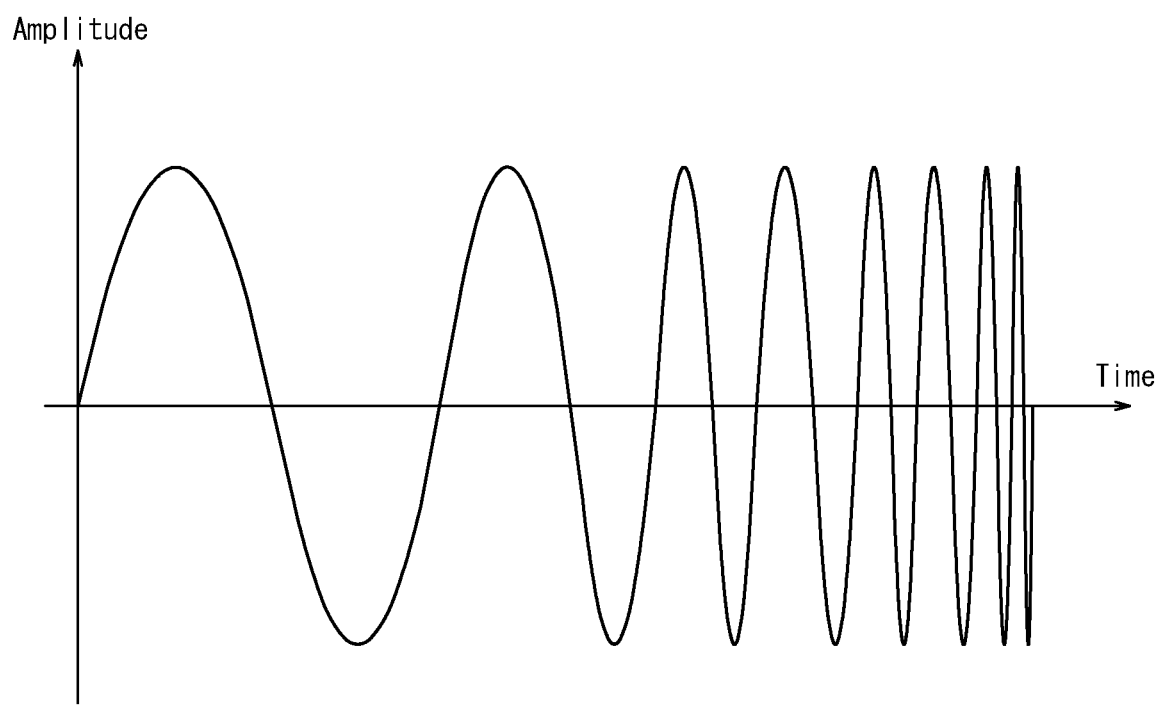
FIG. 15 is a diagram illustrating an example of an incident wave in the magnetic detector in FIG. 13.

The incident wave detected by the calculator 120 is a sine wave pulse swept and output by the signal generator 130. FIG. 15 illustrates an example of an incident wave detected by the calculator 120. In the example illustrated in FIG. 15, the sine wave pulse is continuously swept from low to high frequencies. Here, the term "sine wave pulse" is used to indicate one cycle of a sinusoidal waveform. In other words, the "sine wave pulse" has both positive and negative portions of the sinusoidal waveform. In the example illustrated in FIG. 15, although the sine wave pulse is swept so as to smoothly change from a low frequency to a high frequency, the waveform of the incident wave is not limited to this. The waveform of the incident wave may be, for example, a waveform in which the frequency of the sine wave pulse is switched every one cycle or N cycle.

The calculator 120 detects the pulse input from the transmission line 10 via the directional coupler 140 as a reflected wave.

The signal generator 130 generates a sine wave pulse. The signal generator 130 sweeps a sine wave pulse and outputs it. The sine wave pulse swept and output by the signal generator 130 has, for example, a waveform as illustrated in FIG. 15. Here, "sweeps and outputs" means that a sine wave pulse is output while the frequency thereof is changed. The signal generator 130 may output a sine wave pulse while changing the frequency from 10 MHz to 50 GHz, for example.

The signal generator 130 is connected to a signal detector 121 of the calculator 120 and the directional coupler 140. The sine wave pulse swept and output by the signal generator 130 is input, as an incident wave, to the transmission line 10 via the directional coupler 140. Further, the sine wave pulse swept and output by the signal generator 130 is input to the signal detector 121 of the calculator 120.

The directional coupler 140 interconnects the transmission line 10, the calculator 120 and the signal generator 130. The incident wave from the signal generator 130 is input to the transmission line 10 via the directional coupler 140. The reflected wave from the transmission line 10 is input to the signal detector 121 of the calculator 20 via the directional coupler 140. The reflected wave from the transmission line 10 is a reflected wave generated to an incident wave due to the impedance mismatching at the magnetic field application position of the transmission line 10.

Subsequently each functional block of the calculator 120 will be described. The calculator 120 includes a signal detector 121, a controller 122 and a memory 123.

The signal detector 121 detects the incident wave input from the signal generator 130 and the reflected wave input from the directional coupler 140. The signal detector 121 detects the vector ratio of the reflected wave to the incident wave for each frequency of the sine wave pulse swept and output by the signal generator 130. The vector ratio here is the vector defined by the reflectance and the phase difference of the reflected wave to the incident wave. The reflectance of the reflected wave to the incident wave is the amplitude of the reflected wave divided by the amplitude of the incident wave. Further, the phase difference of the reflected wave to the incident wave is obtained by subtracting the phase of the incident wave from the phase of the reflected wave.

Figure 16:
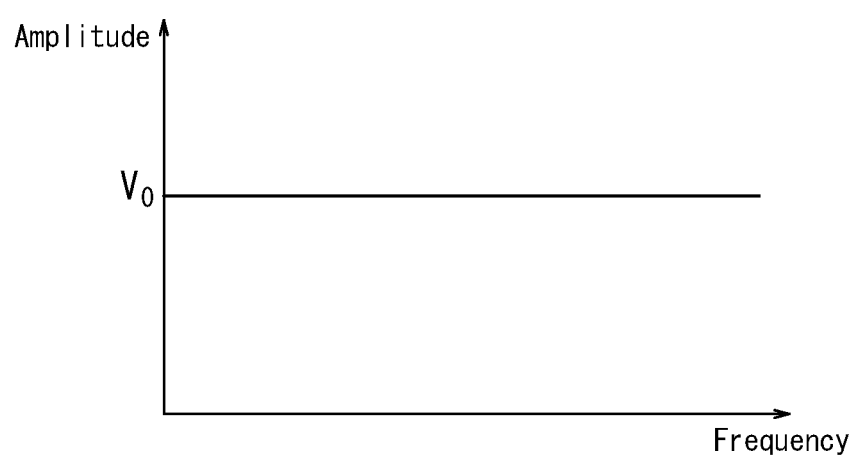
FIG. 16 is a diagram illustrating an example of an amplitude of the incident wave in the magnetic detector in FIG. 13.

Here, for example, the amplitude of the sine wave pulse swept and output as an incident wave by the signal generator 130 may be constant with respect to the frequency. In FIG. 16, the amplitude $V_o$ is constant with respect to the frequency.

For example, the signal detector 121 detects the reflected wave to the incident wave having a frequency characteristic as illustrated in FIG. 16 for each frequency, and detects the reflectance of the reflected wave to the incident wave and the phase difference of the reflected wave to the incident wave. In this manner, the signal detector 121 detects the reflectance and the phase difference of the reflected wave to the incident wave as a relative value. Thus, even if the incident wave fluctuates, the signal detector 121 can cancel the fluctuation and detect the reflectance and the phase difference of the reflected wave to the incident wave. That is, the signal detector 121 can remove the jitter of the incident wave, and can perform a synchronized measurement without temporal fluctuation of signal.

The signal detector 121 includes a filter having a variable pass b and (e. g., a bandpass filter or an Intermediate Frequency (IF) filter). When the filter is a bandpass filter, the pass band of the bandpass filter is controlled in response to a command from controller 122. The controller 122 controls the pass band of the bandpass filter so as to pass the sine wave pulse output by the signal generator 130 and attenuate signals of the other frequencies. This allows the bandpass filter included in the signal detector 121 to attenuate, of the noise contained in the reflected wave, the noise in the frequency band other than the sine wave pulse output by the signal generator 130. Therefore, the signal detector 121 can improve the SN ratio of the reflected wave received by the calculator 120.

It is not essential for the signal detector 121 to include a bandpass filter. The signal detector 121 may not include a bandpass filter.

The signal detector 121 may have the same function as that of the input circuit 21 illustrated in FIG. 1. The signal detector 121 may have the same function as that of the AD converter 22 illustrated in FIG. 1.

The signal detector 121 may detect an incident wave and a reflected wave in the state of an analog signal, or may detect an incident wave and a reflected wave in the state of a digital signal.

The controller 122 controls each component of the calculator 120. The controller 122 may be configured as a processor such as a CPU. The details of the function of the controller 122 will be described later.

The memory 123 is connected to the controller 122. The memory 123 has any storage device such as HDD, SSD, EEPROM, ROM and RAM. The memory 123 may function as, for example, a main storage, an auxiliary storage, or a cache memory. The memory 123 is not limited to the one built in the calculator 120, and may be an external storage device connected by a digital input/output port such as a USB or the like.

The controller 122 obtains the amplitude and the phase difference of the reflected wave to the incident wave for each frequency of the incident wave from the signal detector 121. The controller 122 generates the frequency domain data of the reflectance on the basis of the amplitude of the reflected wave to the incident wave. The controller 122 generates the frequency domain data of the phase difference on the basis of the phase difference of the reflected wave to the incident wave. The controller 122 applies an inverse Fourier transform to the frequency domain data of the reflectance and the frequency domain data of the phase difference to generate the time domain data of the reflected wave.

The controller 122 processes the time domain data of the reflected wave in the same way as the processing performed by the magnetic detector 1 illustrated in FIG. 1 to the incident wave and the reflected wave, and calculates the position and the strength of the magnetic field applied to the transmission line 10

When calculating the magnetic field application position of the transmission line 10 and the strength of the magnetic field applied to the transmission line 10, the calculator 120 may use the data of the difference obtained by subtracting the offset data from the data of the reflected wave detected when the magnetic field is applied as the reflected wave data used for calculating the magnetic field application position and the strength of the magnetic field. The calculator 120 may store, as the offset data, the data of the reflected wave detected in the state where no magnetic field is applied to the transmission line 10 in the memory 123. In this case, the calculator 120 may store, as the offset data of the frequency domain data of the reflectance and the frequency domain data of the phase difference, the data of the reflectance and the phase difference detected in the state where no magnetic field is applied to the transmission line 10 in the memory 123, or may store, as the offset data of the time domain data of the reflected wave, in the memory 123.

In this manner, the calculator 120 uses the data of the difference obtained by subtracting the offset data from the data of the reflectance and the phase difference detected when the magnetic field is applied, and thus can reduce the influence of the reflected wave caused by the mechanical tolerance of the components of the transmission line 10, distortion caused by bending, etc. of the transmission line 10, environmental magnetic fields applied from the initial state (e.g., geomagnetic field or magnetic field generated by the electronic devices), and the impedance mismatching between transmission lines (e.g., between a 50Ω coaxial cable and the transmission line 10).

The following describes the processing by the calculator 120, taking as an example of the case where the calculator 120 uses the data of the difference obtained by subtracting the offset data from the data of the reflectance and the phase difference detected when a magnetic field is applied.

The controller 122 controls the signal generator 130 with no magnetic field applied to the transmission line 10 to allow the signal generator 130 to sweep and output a sine wave pulse as an incident wave. The frequency characteristics of the sine wave pulse swept and output by the signal generator 130 may have the amplitude characteristics illustrated in FIG. 16.

The controller 122 produces, in the state where no magnetic field is applied to the transmission line 10, the frequency domain data of the reflectance and the frequency domain data of the phase difference when the signal generator 130 sweeps the sine wave pulse and outputs it, from the incident wave input via the signal detector 121 and the reflected wave input via the directional coupler 140 and the signal detector 121.

Figure 17A:
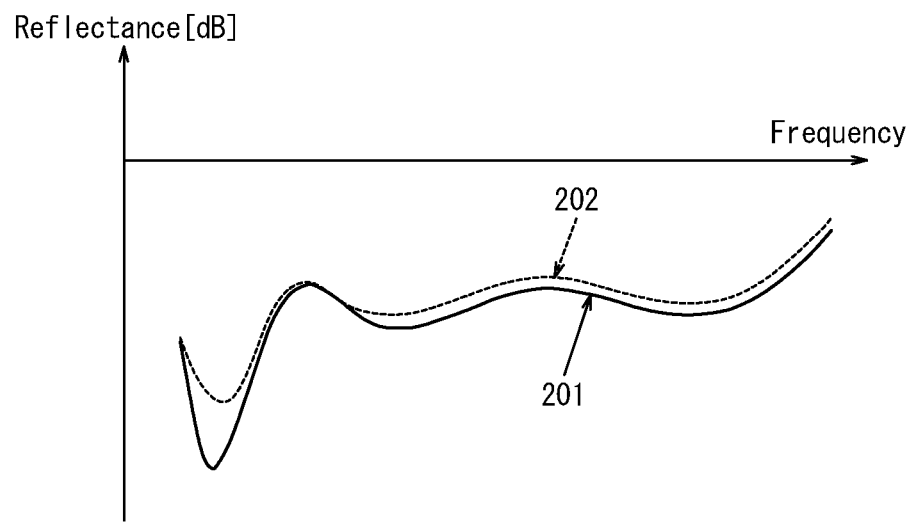
FIG. 17 A is a diagram illustrating an example of a reflectance of a reflected wave to an incident wave in the magnetic detector in FIG. 13.
Figure 17B:
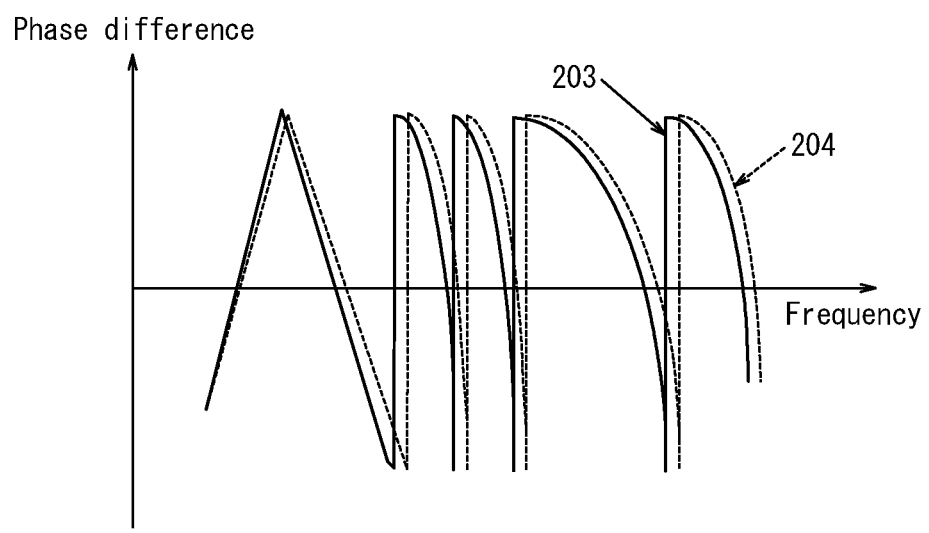

The controller 122 transforms, through an inverse Fourier transform, the frequency domain data of the reflectance and the frequency domain data of the phase difference into the time domain data of the reflected wave. When the reflectance and the phase difference of the reflected wave to the incident wave have the frequency characteristics as illustrated in FIGS. 17A and 17B, respectively, the time domain data of the reflected wave is an impulse response to an incident wave as an impulse signal. Further, the controller 122 may integrate the impulse signal with respect to time and convert it into a step signal. In this case, the time domain data of the reflected wave is a step response to an incident wave as a step signal.

An example of the reflectance of the reflected wave to the incident wave obtained by the controller 122 with no magnetic field applied to the transmission line 10 is the data indicated by the broken line 202 in FIG. 17A, for example. An example of the phase difference of the reflected wave to the incident wave obtained by the controller 122 with no magnetic field applied to the transmission line 10 is the data indicated by the broken line 204 in FIG. 17B, for example.

Subsequently, the controller 122 controls the signal generator 130 with the magnetic field applied to the transmission line 10 to sweep the sine wave pulse as an incident wave and output it. The waveform of the incident wave output by the signal generator 130 at this time is the same waveform as that of the incident wave output by the signal generator 130 with no magnetic field applied to the transmission line 10.

The controller 122 obtains, with the magnetic field applied to the transmission line 10, the frequency domain data of the reflectance and the frequency domain data of the phase difference when the signal generator 130 sweeps the sine wave pulse and outputs it, from the incident wave input via the signal detector 121 and the reflected wave input via the directional coupler 140 and the signal detector 121.

An example of the reflectance of the reflected wave to the incident wave obtained by the controller 122 with the magnetic field applied to the transmission line 10 is the data illustrated by the solid line 201 in FIG. 17A, for example. An example of the phase difference of the reflected wave to the incident wave obtained by the controller 122 with the magnetic field applied to the transmission line 10 is the data indicated by the solid line 203 in FIG. 17B, for example.

The controller 122 transforms the frequency domain data of the reflectance and the frequency domain data of the phase difference obtained with no magnetic field applied to the transmission line 10 into the time domain data of the reflected wave through an inverse Fourier transform. An example of the time domain data of the reflected wave with no magnetic field applied to the transmission line 10 is the data indicated by the broken line 206 in FIG. 18A, for example. The impulse signal on the vertical axis observed as a reflected wave in FIG. 18A is due to impedance mismatching between transmission lines (e.g., a 50Ω coaxial cable and the transmission line 10).

The controller 122 transforms the frequency domain data of the reflectance and the frequency domain data of the phase difference obtained with the magnetic field applied to the transmission line 10 into the time domain data of the reflected wave through an inverse Fourier transform. An example of the time domain data of the reflected wave with the magnetic field applied to the transmission line 10 is the data indicated by the solid line 205 in FIG. 18A, for example.

Figure 18A:
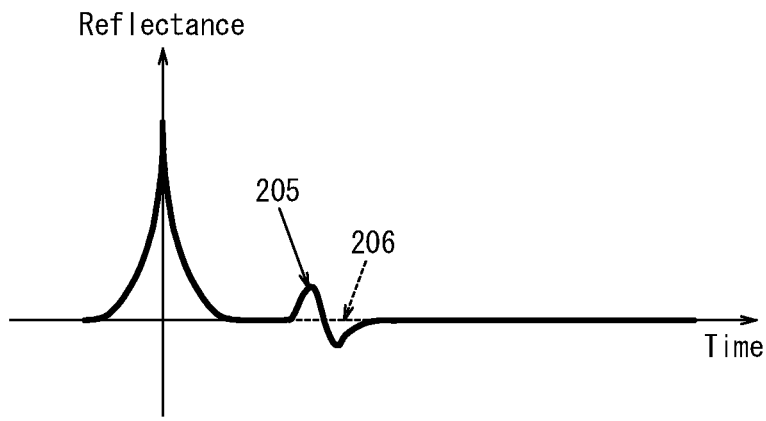
FIG. 18A is a diagram illustrating an example of a case where frequency domain data of reflectance and frequency domain data of phase difference are transformed into time domain data of reflected wave.

The controller 122 may integrate the time domain data of the reflected wave illustrated in FIG. 18A. An example of the time domain data of the reflected wave with no magnetic field applied, that is, the data obtained by integrating the data indicated by the broken line 206 in FIG. 18A is, for example, the data indicated by the broken line 208 in FIG. 18B. An example of the time domain data of the reflected wave with the magnetic field applied, that is, the data obtained by integrating the data indicated by the solid line 205 in FIG. 18A is, for example, the data indicated by the solid line 207 in FIG. 18B. The step signal observed as a reflected wave in FIG. 18B is due to impedance mismatching between transmission lines (e.g., a 50Ω coaxial cable and the transmission line 10), for example, and is the data obtained by integrating the impulse signal on the vertical axis observed as a reflected wave in FIG. 18A.

Figure 18B:
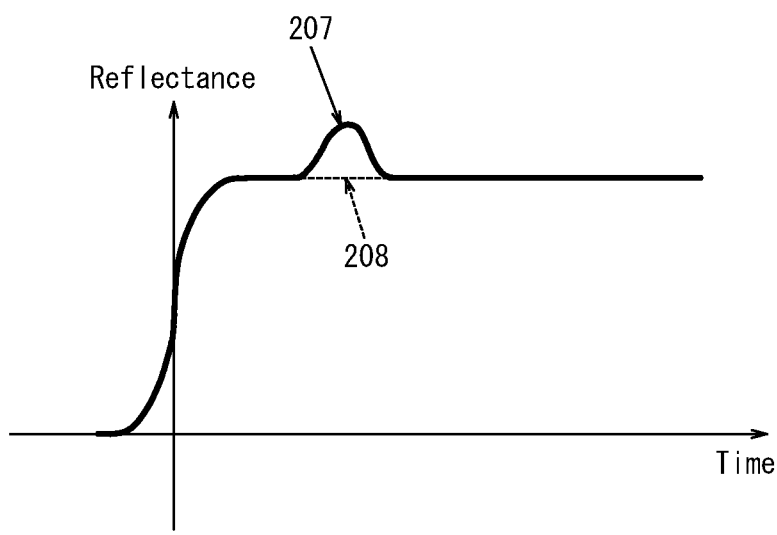
FIG. 18B is a diagram illustrating an example of a case where frequency domain data of reflectance and frequency domain data of phase difference are transformed into time domain data of reflected wave.
Figure 18C:
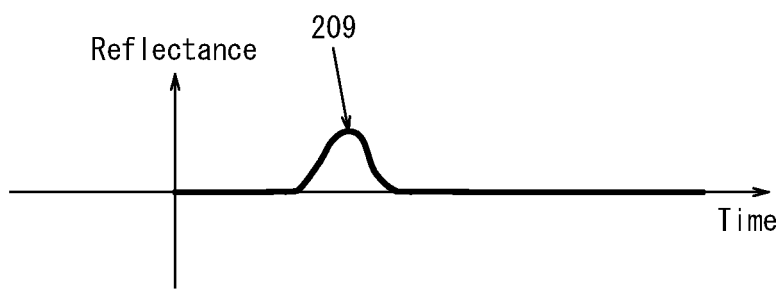
FIG. 18C is a diagram illustrating an example of a case where frequency domain data of reflectance and frequency domain data of phase difference are transformed into time domain data of reflected wave.

Here, the data 208 illustrated in FIG. 18 is the offset data. The controller 122 calculates the data obtained by integrating the time domain data of the reflected wave with the magnetic field applied, that is, the data of the difference obtained by subtracting the offset data, that is, the data 208 illustrated in FIG. 18B, from the data 207 illustrated in FIG. 18B. Thus calculated data of the difference obtained by subtracting the offset data is illustrated as the solid line 209 in FIG. 18C. The influence due to the impedance mismatching between transmission lines (e.g., a 50Ω coaxial cable and the transmission line 10) can be reduced by subtracting the offset data, as illustrated in FIG. 18C.

The controller 122 can calculate the position and the strength of the magnetic field by the same processing as the magnetic detector 1 illustrated in FIG. 1 by using the data illustrated in FIG. 18C as the time domain data of the reflected wave.

The controller 122 may apply, to the frequency domain data of the reflectance and the frequency domain data of the phase difference, a convolution integral processing in the frequency domain and then an inverse Fourier transform, instead of applying an inverse Fourier transform and then an integral processing. In this manner, the controller 122 can reduce the time required for calculation compared to the case where the integral processing is applied after an inverse Fourier transform.

It is to be noted that the processing of integrating the time domain data of the reflected wave as illustrated in FIG. 18B is not essential, and the controller 122 may calculate the position and the strength of the magnetic field by using the data of the difference obtained by subtracting the data 206 from the data 205 illustrated in FIG. 18A as the time domain data of the reflected wave.

Further, the controller 122 may not perform the processing of calculating the data of the difference by subtracting the offset data. In this case, the controller 122 may calculate the position and the strength of the magnetic field by directly using the time domain data of the reflected wave with the magnetic field applied.

It is to be noted that, although S11, which is a forward-direction reflectance, is used as the S-parameter (Scattering parameter) in the 2-terminal pair circuit (4-terminal network), S22, which is a reverse-direction reflectance, may be used. Here, S11 means a signal reflected to one terminal when a signal is input from one terminal, and S22 means a signal reflected to the other terminal when a signal is input from the other terminal.

It is obvious to those skilled in the art that the present disclosure can be realized in predetermined forms other than the embodiments described above, without departing from its spirit or its essential features. Therefore, the above description is exemplary and is not limited thereto. The scope of disclosure is defined by the appended claims, not by the foregoing description. All changes which come within the range of equivalency of the claims are intended to be embraced therein.

For example, the disposition, the number, and the like of each component described above are not limited to the contents illustrated in the above description and drawings. The disposition, the number, and the like of each component may have any configuration as long as the function thereof can be realized.

REFERENCE SIGNS LIST 1, 2 Magnetic detector
10, 10a, 10b, 10c, 10d, 10e, 10f Transmission line
11, 11a, 11b, 11c, 11d, 11e, 11f First conductor (signal line)
12, 12a, 12b, 12c, 12d, 12e, 12f Dielectric body
13, 13a, 13b, 13c, 13d, 13e, 13f Second conductor (shield line)
14, 14a, 14b Coating
15a Conductor
16a Magnetic film
20 Calculator
21 Input circuit
22 AD converter (ADC)
23 Controller
24 Memory
30 Signal generator
40 Connector
50 Terminal resistor
60 Magnet
70 Coil
100 Measuring device 120 Calculator
121 Signal detector
122 Controller
123 Memory
130 Signal generator
140 Directional coupler

The invention claimed is:

1. A magnetic detector, comprising:
a transmission line having a linear first conductor including a magnetic material;
a signal generator configured to input a pulse as an incident wave to the transmission line; and
a calculator configured to detect a reflected wave generated at a magnetic field application position of the transmission line due to impedance mismatching and the incident wave, wherein
the calculator calculates a position and a strength of a magnetic field applied to the transmission line based on the incident wave and the reflected wave.

2. The magnetic detector according to claim 1, wherein the calculator calculates the position of the magnetic field applied to the transmission line based on a difference between time at which the incident wave is detected and time at which the reflected wave is detected.

3. The magnetic detector according to claim 1, wherein the calculator calculates the strength of the magnetic field applied to the transmission line based on an amplitude of the reflected wave.

4. The magnetic detector according to claim 1, wherein the calculator detects data in a state where no magnetic field is applied to the transmission line as offset data, and uses data of a difference obtained by subtracting the offset data from data of the reflected wave in a state where a magnetic field is applied to the transmission line as data of the reflected wave for calculating the position and the strength of the magnetic field.

5. The magnetic detector according to claim 1, wherein the transmission line further comprises a dielectric body and a second conductor, and is any one of a coaxial cable, parallel two lines, a strip line, a microstrip line, a coplanar line and a waveguide.

6. The magnetic detector according to claim 1, wherein, in the linear first conductor, the magnetic material is distributed substantially uniformly, or a magnetic film containing the magnetic material is formed on a surface of the linear first conductor.

7. The magnetic detector according to claim 1, wherein the transmission line includes a plurality of the linear first conductor.

8. The magnetic detector according to claim 1, further comprising a coil configured to apply a bias magnetic field to the transmission line.

9. The magnetic detector according to claim 1, wherein the pulse has a shape of square wave, sine wave, triangular wave or saw-tooth wave.

10. The magnetic detector according to claim 1, wherein, the signal generator sweeps a sine wave pulse as the incident wave and inputs the sine wave pulse to the transmission line; and
the calculator obtains an amplitude and a phase difference of the reflected wave to the incident wave for each frequency of the incident wave swept and input, generates frequency domain data of reflectance based on the amplitude of the reflected wave to the incident wave, generates frequency domain data of phase difference based on the phase difference of the reflected wave to the incident wave, and generates time domain data of the reflected wave through an inverse Fourier transform of the frequency domain data of reflectance and the frequency domain data of phase difference to calculate the position and the strength of the magnetic field applied to the transmission line.

11. The magnetic detector according to claim 10, wherein the signal generator sweeps the sine wave pulse and inputs the sine wave pulse to the transmission line; and
the calculator applies an inverse Fourier transform to the frequency domain data of the reflectance and the frequency domain data of the phase difference to generate the time domain data of the reflected wave as an impulse response, or integrates the frequency domain data of the reflectance and the frequency domain data of the phase difference to which an inverse Fourier transform is applied to generate the time domain data of the reflected wave as a step response.

12. The magnetic detector according to claim 10, wherein the signal generator sweeps the sine wave pulse and inputs the sine wave pulse to the transmission line; and
the calculator applies a convolution integral processing to the frequency domain data of the reflectance and the frequency domain data of the phase difference and then applies an inverse Fourier transform to generate the time domain data of the reflected wave as a step response.

13. The magnetic detector according to claim 1, wherein, the transmission line includes a signal line in which the magnetic material is distributed substantially uniformly or a magnetic film containing the magnetic material is formed on a conductor surface.

14. A magnetic detection method in a magnetic detector comprising a transmission line having a linear first conductor including a magnetic material, a signal generator and a calculator, the magnetic detection method comprising:
inputting, by the signal generator, a pulse as an incident wave to the transmission line;
detecting, by the calculator, a reflected wave caused due to impedance mismatching at a magnetic field application position of the transmission line and the incident wave; and
calculating, by the calculator, a position and a strength of a magnetic field applied to the transmission line based on the incident wave and the reflected wave.

\* \* \* \* \*